(12) United States Patent
No et al.

(10) Patent No.: US 12,243,471 B2
(45) Date of Patent: Mar. 4, 2025

(54) DISPLAY DEVICE

(71) Applicant: Samsung Display Co., LTD., Yongin-si (KR)

(72) Inventors: Sang Yong No, Yongin-si (KR); Hwa Rang Lee, Yongin-si (KR); Kwi Hyun Kim, Yongin-si (KR); Ji Yeon Choi, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/870,319

(22) Filed: Jul. 21, 2022

(65) Prior Publication Data

US 2023/0041072 A1 Feb. 9, 2023

(30) Foreign Application Priority Data

Aug. 3, 2021 (KR) .................. 10-2021-0102221

(51) Int. Cl.
*G09G 3/32* (2016.01)
*G09G 3/3258* (2016.01)
(Continued)

(52) U.S. Cl.
CPC ............. *G09G 3/32* (2013.01); *G09G 3/3258* (2013.01); *H01L 25/0753* (2013.01);
(Continued)

(58) Field of Classification Search
CPC ................... G09G 3/32; G09G 3/3258; G09G 2300/0426; G09G 2300/0443;
(Continued)

(56) References Cited

U.S. PATENT DOCUMENTS 8,089,598 B2  1/2012  Kim et al.
9,633,595 B2  4/2017  Hwang et al.
(Continued)

FOREIGN PATENT DOCUMENTS

JP   2020-091345   6/2020
KR   10-1093352    12/2011
(Continued)

OTHER PUBLICATIONS

International Search Report corresponding to International Application No. PCT/KR2022/011407 dated Nov. 9, 2022.

*Primary Examiner* — Jason M Mandeville
(74) *Attorney, Agent, or Firm* — KILE PARK REED & HOUTTEMAN PLLC

(57) ABSTRACT

A display device includes: a display area and a non-display area; a first pixel area and a second pixel area, each provided in the display area; scan lines extending in a first direction and disposed in the first pixel area and the second pixel area; first sub-scan lines extending in a second direction and disposed in the first pixel area, the second direction intersecting the first direction; second sub-scan lines extending in the second direction and disposed in the first pixel area and the second pixel area; and a pad part provided in the non-display area, the pad part being electrically connected to the first sub-scan lines and the second sub-scan lines. The scan lines are electrically connected to at least one of the first sub-scan lines and the second sub-scan lines. The first sub-scan lines do not overlap the second pixel area in a plan view.

15 Claims, 18 Drawing Sheets

(51) Int. Cl.
*H01L 25/075* (2006.01)
*H01L 27/12* (2006.01)
*H01L 27/15* (2006.01)
*H01L 33/48* (2010.01)

(52) U.S. Cl.
CPC .......... *H01L 27/124* (2013.01); *H01L 27/156* (2013.01); *H01L 33/486* (2013.01); *G09G 2300/0426* (2013.01); *G09G 2300/0443* (2013.01); *G09G 2300/0469* (2013.01); *G09G 2320/0295* (2013.01); *G09G 2320/045* (2013.01); *G09G 2330/12* (2013.01)

(58) Field of Classification Search
CPC ... G09G 2300/0469; G09G 2320/0295; G09G 2320/045; G09G 2330/12; H01L 27/124; H01L 27/156; H01L 25/0753; H01L 33/486
USPC .......................................................... 345/55
See application file for complete search history.

(56) References Cited

U.S. PATENT DOCUMENTS

| | | |
|---|---|---|
| 11,126,049 B2 | 9/2021 | Baba et al. |
| 2006/0290859 A1* | 12/2006 | Ko .................... G02F 1/136286 349/139 |
| 2011/0221715 A1 | 9/2011 | Yang et al. |
| 2014/0043306 A1* | 2/2014 | Min .................... G09G 3/3677 345/204 |
| 2017/0004758 A1 | 1/2017 | Son et al. |
| 2022/0069003 A1 | 3/2022 | Lee et al. |
| 2022/0199677 A1 | 6/2022 | Park et al. |

FOREIGN PATENT DOCUMENTS

| | | |
|---|---|---|
| KR | 10-2014-0071042 | 6/2014 |
| KR | 10-2015-0080118 | 7/2015 |
| KR | 10-2017-0005295 | 1/2017 |
| KR | 10-2020-0085977 | 7/2020 |
| KR | 10-2284296 | 8/2021 |
| KR | 10-2022-0091701 | 7/2022 |

* cited by examiner

DISPLAY DEVICE

CROSS-REFERENCE TO RELATED APPLICATION(S)

The present application claims priority to and the benefit of Korean patent application 10-2021-0102221 under 35 U.S.C. § 119, filed in the Korean Intellectual Property Office (KIPO) on Aug. 3, 2021, the entire contents of which are incorporated herein by reference.

BACKGROUND

1. Technical Field

The disclosure generally relates to a display device capable of improving reliability by improving a charging rate.

2. Description of the Related Art

Recently, as interest in information displays is increased, research and development of display devices have been continuously conducted.

SUMMARY

Embodiments provide a display device capable of improving reliability by improving a charging rate.

In accordance with an aspect of the disclosure, there is provided a display device including: a display area and a non-display area; a first pixel area and a second pixel area, each provided in the display area; scan lines extending in a first direction and disposed in the first pixel area and the second pixel area; first sub-scan lines extending in a second direction and disposed in the first pixel area, the second direction intersecting the first direction; second sub-scan lines extending in the second direction and disposed in the first pixel area and the second pixel area; and a pad part provided in the non-display area, the pad part being electrically connected to the first sub-scan lines and the second sub-scan lines, wherein the scan lines are electrically connected to at least one of the first sub-scan lines and the second sub-scan lines, and wherein the first sub-scan lines do not overlap the second pixel area in a plan view.

A width of the second sub-scan line of the second pixel area may be greater than a width of the second sub-scan line of the first pixel area.

A width of the second sub-scan line of the second pixel area may be greater than a width of the first sub-scan line of the first pixel area.

A width of the second sub-scan line of the second pixel area may be greater than a sum of a width of the first sub-scan line of the first pixel area and a width of the second sub-scan line of the first pixel area.

The first pixel area may be disposed between the second pixel area and the pad part.

The display area may include a first area and a second area divided from the first area with respect to a central line extending in the first direction. The first area may be disposed between the pad part and the second area.

The first sub-scan lines may be electrically connected to scan lines disposed in the first area, and the second sub-scan lines may be electrically connected to scan lines disposed in the second area.

The display device may further include a data line extending in the second direction and disposed in the first pixel area and the second pixel area.

A width of the data line of the second pixel area may be greater than a width of the data line of the first pixel area.

A width of the second sub-scan line of the second pixel area may be substantially equal to a width of the second sub-scan line of the first pixel area.

A width of the second sub-scan line of the second pixel area may be substantially equal to a width of the first sub-scan line of the first pixel area.

The scan lines may be electrically connected respectively to the first sub-scan lines through a contact part between the first pixel area and the second pixel area.

The display device may further include a third pixel area provided in the display area. The second pixel area may be disposed between the first pixel area and the third pixel area.

The second sub-scan lines may extend in the second direction and be disposed in the third pixel area.

A width of the second sub-scan line of the third pixel area may be substantially equal to a width of the second sub-scan line of the second pixel area.

A width of the second sub-scan line of the third pixel area may be greater than a width of the second sub-scan line of the first pixel area.

The scan lines may be electrically connected respectively to the second sub-scan lines through a contact part between the second pixel area and the third pixel area.

The first sub-scan lines may not overlap the third pixel area in a plan view.

The display device may further include: a first electrode, a second electrode, spaced apart from the first electrode in the first pixel area and the second pixel area; and light emitting elements disposed between the first electrode and the second electrode.

The display device may further include: a first connection electrode electrically connecting the first electrode to first ends of the light emitting elements to each other; and a second connection electrode electrically connecting the second electrode to second ends of the light emitting elements to each other.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
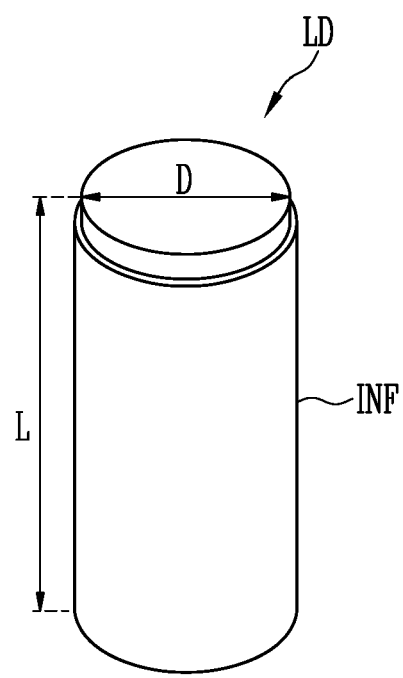
FIGS. 1 and 2 are perspective and cross-sectional views, respectively, schematically illustrating a light emitting element in accordance with an embodiment of the disclosure.

Embodiments of the disclosure will be described hereinafter with reference to the accompanying drawings. Although the embodiments may be modified in various manners and have additional embodiments, embodiments are illustrated in the accompanying drawings and will be mainly described in the specification. However, the scope of the disclosure is not limited to the embodiments in the accompanying drawings and the specification and should be construed as including all changes, equivalents and substitutions included in the spirit and scope of the disclosure.

In the drawings, sizes and thicknesses of elements may be enlarged for clarity and ease of description thereof. However, the disclosure is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

The terminology used herein is for the purpose of describing particular embodiments only and is not construed as limiting the disclosure. As used herein, the singular forms are intended to include the plural forms as well, unless the context clearly indicates otherwise. The terms "comprises/includes" and/or "comprising/including," when used in this specification, specify the presence of mentioned component, step, operation and/or element, but do not exclude the presence or addition of one or more other components, steps, operations and/or elements.

Further, in the specification, the phrase "in a plan view" means when an object portion is viewed from above, and the phrase "in a cross-sectional view" means when a cross-section taken by vertically cutting an object portion is viewed from the side.

Throughout the specification, when an element is referred to as being "connected", "coupled" or "accessed" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element, layer, film, region, substrate, or area, is referred to as being "on" another element, layer, film, region, substrate, or area, it may be directly on the other element, layer, film, region, substrate, or area, or intervening elements, layers, films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

reference numerals refer to like elements throughout the specification.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Unless otherwise defined or implied herein, all the terms used herein (including technical and scientific terms) may the same meaning as commonly understood by those skilled in the art to which the disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Figure 2:
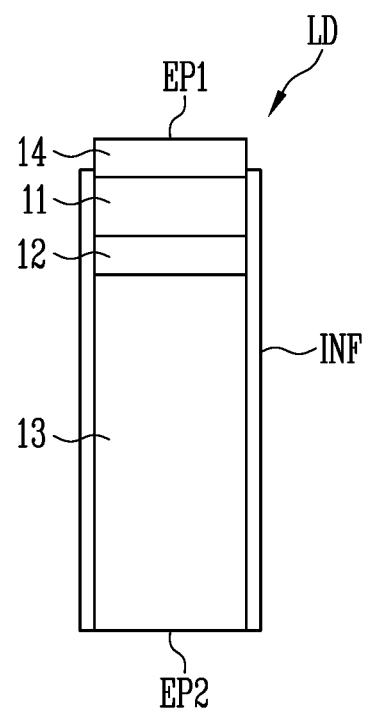

FIGS. 1 and 2 are perspective and cross-sectional views, respectively, schematically illustrating a light emitting element in accordance with an embodiment of the disclosure. Although a pillar-shaped light emitting element LD is illustrated in FIGS. 1 and 2, the kind and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in a pillar shape extending in a direction. The light emitting element LD may have a first end portion EP1 and a second end portion EP2. One of the first and second semiconductor layers 11 and 13 may be disposed at the first end portion EP1 of the light emitting element LD. Another of the first and second semiconductor layers 11 and 13 may be disposed at (or disposed on) the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In an embodiment, the light emitting element LD may be a light emitting element manufactured in a pillar shape by an etching process, or the like. In the specification, the term "pillar shape" may include a rod-like shape (or bar-like shape) such as a cylinder or a polyprism, and aspect ratio of the rod-like shape (or bar-like shape) may be greater than 1. The cross-sectional shape of the pillar shape is not limited thereto.

The light emitting element LD may have a small size corresponding to a degree of nanometer scale to micrometer scale. In an example, the light emitting element LD may have a diameter D (or width) in a range of nanometer scale to micrometer scale and/or a length L in a range of nanometer scale to micrometer scale. However, the size of the light emitting element LD is not limited thereto, and the size of the light emitting element LD may be variously changed according to design conditions of various types of devices (e.g., display device, or the like), which may use the light emitting element LD as a light source (e.g., light emitting device).

The first semiconductor layer 11 may be a first conductivity type semiconductor layer. For example, the first semiconductor layer 11 may include a p-type semiconductor layer. In an example, the first semiconductor layer 11 may include at least one semiconductor material among InAlGaN, GaN, AlGaN, InGaN, AlN, and InN, and include a p-type semiconductor layer doped with a first conductivity type dopant such as Mg. However, the material constituting the first semiconductor layer 11 is not limited thereto. The first semiconductor layer 11 may be configured with various materials.

The active layer 12 may be formed (or disposed) between the first semiconductor layer 11 and the second semiconductor layer 13, and may be formed in a single-quantum well structure or a multi-quantum well structure. The position of the active layer 12 may be variously changed according to a kind of the light emitting element LD. In an embodiment, a material such as AlGaN or AlInGaN may be form the active layer 12. The active layer 12 may be configured with various materials. A clad layer (not shown) doped with a conductive dopant may be formed (or disposed) on the top and/or the bottom of the active layer 12. In an example, the clad layer may be formed as or implemented with, for example, an AlGaN layer or InAlGaN layer.

The second semiconductor layer 13 may be formed on the active layer 12, and may include a semiconductor layer having a type different from that of the first semiconductor layer 11. For example, the second semiconductor layer 13 may include an n-type semiconductor layer. In an example, the second semiconductor layer 13 may include at least one semiconductor material of InAlGaN, GaN, AlGaN, InGaN, AlN, and InN, and include an n-type semiconductor layer doped with a second conductivity type dopant such as Si, Ge or Sn. However, the material constituting the second semiconductor layer 13 is not limited thereto. The second semiconductor layer 13 may be configured with various materials.

In case that a voltage equal to or more than a threshold voltage is applied to both ends (e.g., first and second end portions EP1 and EP2) of the light emitting element LD, the light emitting element LD emits light as electron-hole pairs are combined in the active layer 12. The light emission of the light emitting element LD may be controlled by using such a principle, so that the light emitting element LD may be used as a light source for various light emitting devices, including a pixel of a display device.

The electrode layer 14 may be disposed on the first end portion EP1 and/or the second end portion EP2 of the light emitting element LD. Although a case where the electrode layer 14 is formed on the first semiconductor layer 11 is exemplified in FIG. 2, the disclosure is not limited thereto. For example, a separate electrode layer may be further disposed on the second semiconductor layer 13.

The electrode layer 14 may include a transparent metal or a transparent metal oxide. In an example, the electrode layer 14 may include at least one of indium tin oxide (ITO), indium zinc oxide (IZO), zinc oxide (ZnO), and zinc tin oxide (ZTO), but the disclosure is not limited thereto. In case that the electrode layer 14 is made of a transparent metal or a transparent metal oxide, light generated in the active layer 12 of the light emitting element LD may pass through the electrode layer 14 and be emitted to the outside of the light emitting element LD.

The light emitting element LD may further include an insulative film INF provided on a surface (e.g., side surface) of the light emitting element LD. The insulative film INF may be disposed directly on surfaces of the first semiconductor layer 11, the active layer 12, the second semiconductor layer 13, and/or the electrode layer 14. The insulative film INF may expose the first and second end portions EP1 and EP2 of the light emitting element LD, which have different polarities. In an embodiment, the insulative film INF may expose a side portion of the electrode layer 14 and/or the second semiconductor layer 13, adjacent to the first and second end portions EP1 and EP2 of the light emitting element LD.

The insulative film INF may include at least one of aluminum oxide ($AlO_x$), aluminum nitride ($AlN_x$), silicon oxide ($SiO_x$), silicon nitride ($SiN_x$), silicon oxynitride ($Si-O_xN_y$), zirconium oxide ($ZrO_x$), hafnium oxide ($HfO_x$), and titanium dioxide ($TiO_2$). For example, the insulative film INF may be configured as a double-layer, and layers constituting the double-layer may include different materials. The layers constituting the double layer of the insulative film INF may be formed by different processes. In an embodiment, the insulative film INF may be configured as a double-layer configured with aluminum oxide ($AlO_x$) and silicon oxide ($SiO_x$), but the disclosure is not limited thereto. In an embodiment, the insulative film INF may be omitted.

In case that the insulative film INF is provided on the surface of the light emitting element LD, the insulative film INF may prevent the active layer 12 from being short-circuited with at least one electrode (e.g., at least one of electrodes connected to both ends of the light emitting element LD), etc. Accordingly, the electrical stability of the light emitting element LD may be ensured or secured. The insulative film INF may minimize a surface defect of the light emitting element LD, thereby improving the lifespan and efficiency of the light emitting element LD.

A light emitting device including the above-described light emitting element LD may be used in various kinds of devices which include a light source, including a display device. For example, light emitting elements LD may be disposed in each pixel of a display panel, and be used as a light source of each pixel. However, the application field of the light emitting element LD is not limited to the above-described example. For example, the light emitting element LD may be used in other types of devices that include a light source, such as a lighting device.

Figure 3:
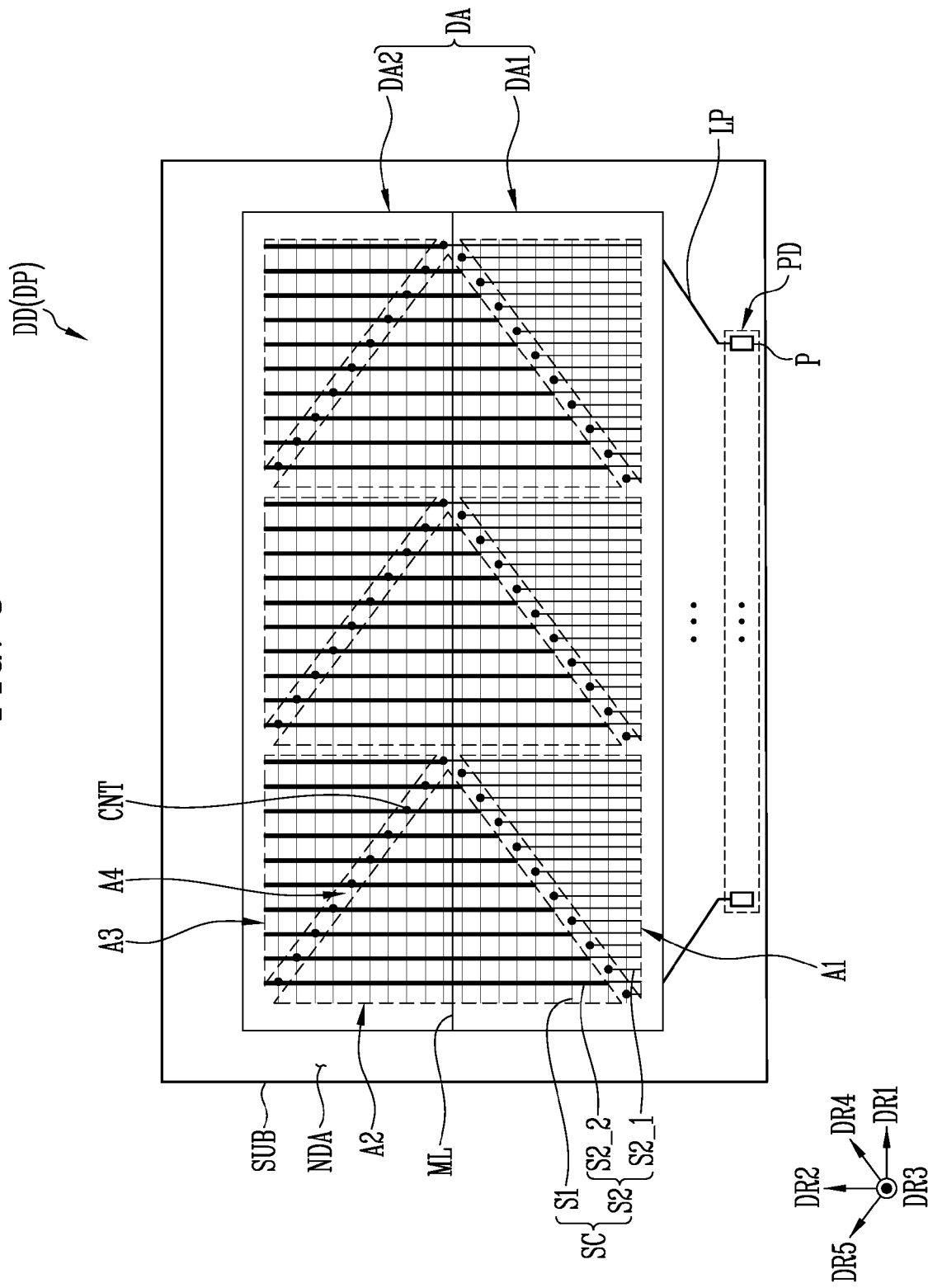
FIGS. 3 and 4 are schematic plan views illustrating a display device in accordance with an embodiment of the disclosure.
Figure 4:
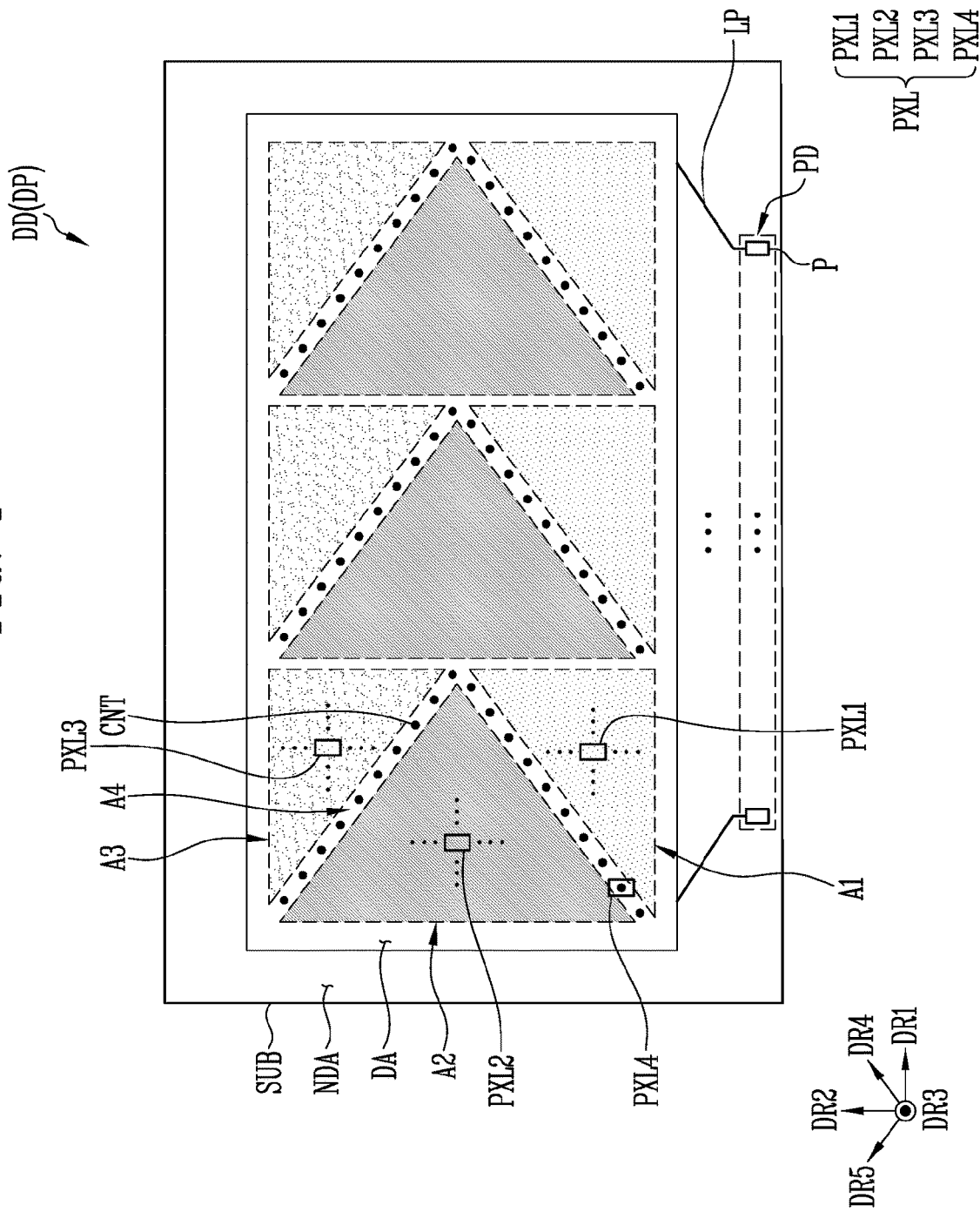

FIGS. 3 and 4 are schematic plan views illustrating a display device in accordance with an embodiment of the disclosure.

In FIGS. 3 and 4, a display device DD, particularly, a display panel DP provided in the display device DD will be illustrated as an example of an electronic device which can use, as a light source, the light emitting element LD described in the embodiment shown in FIGS. 1 and 2.

For convenience of description, in a plan view, an X-axis direction is represented as a first direction DR1, a Y-axis direction is represented as a second direction DR2, a Z-axis direction intersecting the first direction DR1 and the second direction DR2 is represented as a third direction DR3, an oblique direction between the first direction DR1 and the second direction DR2 is represented as a fourth direction DR4, and an oblique direction between an opposite direction of the first direction DR1 and the second direction DR2 is represented as a fifth direction DR5.

Referring to FIGS. 3 and 4, the display device DD in accordance with the embodiment of the disclosure may include a substrate SUB including pixels PXL.

The substrate SUB may form (or constitute) a base member of the display panel DP, and may be a rigid or flexible substrate or film. In an example, the substrate SUB may be configured as or implemented with, for example, a rigid substrate made of glass or tempered glass, or a flexible substrate (or thin film) made of a plastic or metallic material. The material and/or property of the substrate SUB is not limited thereto.

The display panel DP and the substrate SUB for forming the display panel DP may include a display area DA for displaying an image and a non-display area NDA except the display area DA. For example, the non-display area NDA may be a remaining area of the display panel DP except the display area DA.

The display area DA may be divided into a first pixel area A1, a second pixel area A2, a third pixel area A3, and a fourth pixel area A4. The first to third pixel areas A1, A2, and A3 may be provided in the second direction DR2. For example, the first pixel area A1 may be disposed between a pad part PD and the second pixel area A2. The second pixel area A2 may be disposed between the first pixel area A1 and the third pixel area A3.

The fourth pixel area A4 may be disposed between the first pixel area A1 and the second pixel area A2. The fourth pixel area A4 may be disposed between the second pixel area A2 and the third pixel area A3. For example, the first pixel area A4 may be disposed in a region between the first pixel area A1 and the second pixel area A2 and a region between the second pixel area A2 and the third pixel area A3. The fourth pixel area A4 may include contact parts CNT. The contact parts CNT may be selectively provided in (e.g., provided only in) the fourth pixel area A4. The contact parts CNT may not be provided in (or disposed in) other areas than the fourth pixel area A4. For example, the first to third pixel areas A1, A2, and A3 may not include the contact parts CNT.

In an example, the contact parts CNT may be arranged in the fourth direction DR4 between the first pixel area A1 and the second pixel area A2. The contact parts CNT may be arranged in the fifth direction DR5 between the second pixel area A2 and the third pixel area A3. For example, the contact parts CNT may be arranged in the fourth direction DR4 in the region between the first pixel area A1 and the second pixel area A2 and arranged in the fifth direction DR5 in the region between the second pixel area A2 and the third pixel area A3. However, the disclosure is not limited thereto.

At least one area of the first to fourth pixel areas A1, A2, A3, and A4 may have a size or area different from that of another area. In an example, the fourth pixel area A4 may have a size or area smaller than that of each of the first pixel area A1, the second pixel area A2, and/or the third pixel area A3. The second pixel area A2 may have a size or area greater than that of each of the first pixel area A1, the third pixel area A3, and/or the fourth pixel area A4. However, the disclosure is not limited thereto.

A first pixel PXL1 may be disposed in the first pixel area A1. A second pixel PXL2 may be disposed in the second pixel area A2. A third pixel PXL3 may be disposed in the third pixel area A3. A fourth pixel PXL4 may be disposed in the fourth pixel area A4. The pixels PXL (e.g., first to fourth pixels PXL1 to PXL4) may be arranged or regularly arranged according to a stripe arrangement structure, a PENTILE™ arrangement structure, or the like. However, the arrangement structure of the pixels PXL is not limited thereto, and the pixels PXL may be arranged in the display area DA by using various structures and/or methods.

Signal lines electrically connected to the pixels PXL may be further disposed in the display area DA. For example, scan lines SC for transferring a signal (e.g., a scan signal and/or a control signal) to each of the pixels PXL may further be disposed in the display area DA. The scan lines SC may include first scan lines S1 and second scan lines S2. For example, each of the pixels PXL may include one first scan line S1 and two second scan lines S2.

Each of the first scan lines S1 may extend in the first direction DR1 in the display area DA, and the first scan lines S1 may be arranged or sequentially arranged in the second direction DR2. The first scan lines S1 may be commonly connected to pixels PXL arranged on a same pixel row.

Each of the second scan lines S2 may extend in the second direction DR2 in the display area DA, and the second scan lines S2 may be arranged (e.g., sequentially arranged) in the first direction DR1. The second scan lines S2 may be electrically connected to a driving part (not shown) through pads P of the pad part PD and may be supplied with a predetermined signal from the driving part.

Each of the second scan lines S2 may include a first sub-scan line S2_1 and a second sub-scan line S2_2. The first sub-scan line S2_1 and the second sub-scan line S2_2 may extend in the second direction DR2, and be arranged or alternately arranged in the first direction DR1.

The first scan lines S1 may be electrically connected respectively to at least some of the second scan lines S2 through the contact parts CNT provided in the fourth pixel area A4. For example, some of the first scan lines S1 may be electrically connected to the first sub-scan lines S2_1, and another of the first scan lines S1 may be electrically connected to the second sub-scan lines S2_2.

In an embodiment, the display area DA may include a first area DA1 and a second area DA2, which are divided with respect to a central line ML extending in the first direction DR1. The first area DA1 may be disposed between the pad part PD and the second area DA2. For example, the first area DA1 may be a lower end (or lower portion) of the display panel DP, and the second area DA2 may be an upper end (or upper portion) of the display panel DP.

First scan lines S1 of the first area DA1 may be electrically connected respectively to the first sub-scan lines S2_1. First scan lines S1 of the second area DA2 may be electrically connected respectively to the second sub-scan lines S2_2. For example, the first sub-scan lines S2_1 may be connected to (or extended to) the first area DA1, and electrically connected to pixels PXL at the lower end (or lower portion) of the display panel DP. The second sub-scan lines S2_2 may be connected to (or extended to) the second area DA2, and electrically connected to pixels PXL at the upper end (or upper portion) of the display panel DP.

The first scan lines S1 of the first area DA1 may be electrically connected respectively to the first sub-scan lines S2_1 through the contact parts CNT disposed between the first pixel area A1 and the second pixel area A2. The first scan lines S1 of the second area DA2 may be electrically connected respectively to the second sub-scan lines S2_2 through the contact parts CNT disposed between the second pixel area A2 and the third pixel area A3.

In an embodiment, the first sub-scan lines S2_1 may be disposed in the first pixel area A1, and extend in the second direction DR2 in the first pixel area A1. The first sub-scan lines S2_1 may extend up to the fourth pixel area A4, and may be electrically connected to the first scan lines S1 of the first area DA1 through the contact parts CNT provided in (or disposed in) the fourth pixel area A4. The first sub-scan lines S2_1 may be omitted in the second pixel area A2 and/or the third pixel area A3. For example, the first sub-scan lines S2_1 may not overlap the second pixel area A2 and/or the third pixel area A3 in a plan view.

The second sub-scan lines S2_2 may be disposed in the first to fourth pixel areas A1, A2, A3, and A4, and extend in the second direction DR2 in the first to fourth pixel areas A1, A2, A3, and A4. The second sub-scan lines S2_2 may be electrically connected to the first scan lines S1 of the second area DA2 through the contact parts CNT provided in (or disposed in) the fourth pixel area A4. The second sub-scan lines S2_2 may have a line width extended by a space in which the first sub-scan lines S2_1 are omitted in the second pixel area A2 and/or the third pixel area A3. For example, the first sub-scan lines S2_1 may be omitted in the second pixel area A2 and/or the third pixel area A3, and the line width of the second sub-scan lines S2_2 in the second pixel area A2 and/or the third pixel area A3 may be increased by the space secured (or formed) by the omission of the first sub-scan lines S2_1. Accordingly, resistance of the scan lines in the second area DA2, e.g., at the upper end of the display panel DP, is decreased, so that a charging rate can be improved. This will be described in detail later with reference to FIGS. 6 to 10.

In an embodiment, the pixels PXL may include first sub-pixels emitting light of a first color, second sub-pixels emitting light of a second color, and third sub-pixels emitting light of a third color. At least one first sub-pixel, at least one second sub-pixel, and at least one third sub-pixel, which are disposed adjacent to each other, may constitute a pixel part capable of emitting lights of various colors. For example, each of the first to third sub-pixels may be a sub-pixel emitting light of a predetermined color. In an embodiment, the first sub-pixel may be a red pixel emitting light of red, the second sub-pixel may be a green pixel emitting light of green, and the third sub-pixel may be a blue pixel emitting light of blue. However, the disclosure is not limited thereto. The color, kind, and/or number of the pixels PXL or sub-pixels are not limited thereto, and may be variously changed.

The pixel PXL may include at least one light source driven by a predetermined control signal (e.g., a scan signal and a data signal) and/or a power source (e.g., a first power source and a second power source). In an embodiment, the light source may include at least one light emitting element LD in accordance with the embodiment shown in FIGS. 1 and 2, e.g., a subminiature pillar-shaped light emitting element LD having a size small to a degree of nanometer scale to micrometer scale. However, the disclosure is not limited thereto. Various types of light emitting elements LD may be used as the light source of the pixel PXL.

In an embodiment, each pixel PXL may be configured as or implemented with, for example, an active pixel. However, the kind, structure, and/or driving method of pixels PXL which may be applied to the display device are not limited thereto. For example, each pixel PXL may be configured as or implemented with, for example, a pixel of a passive or active light emitting display device, and may have various structures and/or use various driving methods.

The non-display area NDA may be provided at (or disposed on) at least one side of the display area DA. The non-display area NDA may surround an edge (or edges) of the display area DA.

Various line parts LP electrically connected to the pixels PXL of the display area DA, and/or the pad part PD may be disposed in the non-display area NDA.

The line part LP may be provided in the non-display area NDA, and electrically connect the pad part PD and the pixels PXL to each other. The line part LP may provide a signal to each pixel PXL, and include a fan-out line electrically connected to signal lines, e.g., a scan line, a data line, and an emission control lines, which are electrically connected to each pixel PXL. The line part LP may include a fan-out line electrically connected to signal lines, e.g., a control line, a sensing line, and the like, which are electrically connected to each pixel PXL, to compensate for an electrical characteristic change of each pixel PXL in real time.

The pad part PD may include pads P. The pads P may supply (or transfer) driving powers (e.g., power sources) and signals, which may drive the pixels PXL provided in the display area and/or a built-in circuit.

The display device DD may further include a circuit board (not shown) electrically connected to the display panel DP through the pad part PD. The circuit board may be a flexible circuit board, but the disclosure is not limited thereto.

Figure 5:
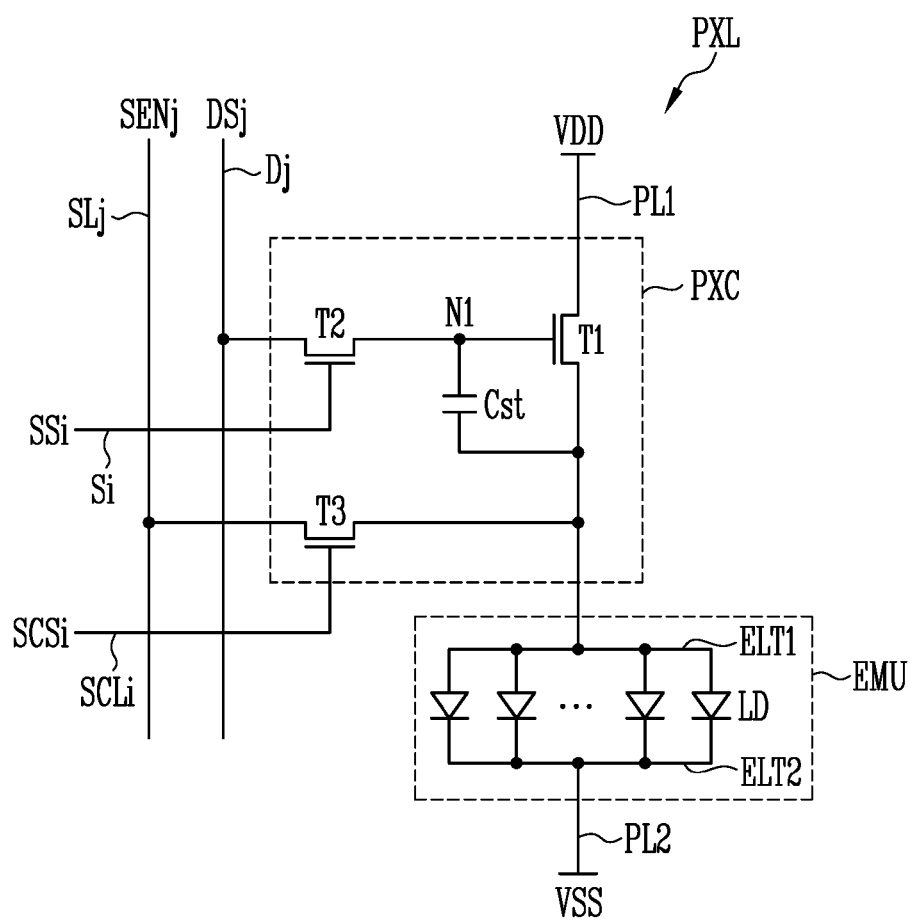
FIG. 5 is an equivalent circuit diagram schematically illustrating a pixel in accordance with an embodiment of the disclosure.

FIG. 5 is an equivalent circuit diagram schematically illustrating a pixel in accordance with an embodiment of the disclosure.

In an embodiment, the pixel PXL shown in FIG. 5 may be any one of first to fourth pixels PXL1, PXL2, PXL3, and PXL4 provided in the display panel DP shown in FIGS. 3 and 4. The first to fourth pixels PXL1, PXL2, PXL3, and PXL4 may have structures substantially identical or similar to one another.

Referring to FIG. 5, the pixel PXL may include a light emitting part EMU for generating light with a luminance corresponding to a data signal and a pixel circuit PXC for driving the light emitting part EMU.

The light emitting part EMU may include at least one light emitting element LD electrically connected between a first power source VDD and a second power source VSS. For example, the light emitting element EMU may include a first electrode ELT1, a second electrode ELT2, and light emitting elements LD. The first electrode ELT1 may be electrically connected to the first power source VDD via the pixel circuit PXC and a first power line PL1. The second electrode ELT2 may be electrically connected to the second power source VSS through a second power line PL2. The light emitting elements LD may be electrically connected between the first and second electrodes ELT1 and ELT2. In an embodiment, the first electrode ELT1 may be an anode electrode, and the second electrode ELT2 may be a cathode electrode.

Each of the light emitting elements LD may include a first end portion EP1 (e.g., refer to FIG. 2) and a second end portion EP2 (e.g., refer to FIG. 2). The first end portion EP1 (e.g., refer to FIG. 2) may be electrically connected to the first power source VDD through the first electrode ELT1 and/or the pixel circuit PXC. The second end portion EP2 (e.g., refer to FIG. 2) may be electrically connected to the second power source VSS through the second electrode ELT2. For example, the light emitting elements LD may be electrically connected in a forward direction between the first and second electrodes ELT1 and ELT2. The light emitting elements LD electrically connected in the forward direction between the first power source VDD and the second power source VSS may respectively form effective light sources, and the effective light sources may constitute or be implemented with the light emitting part EMU of the pixel PXL.

The first power source VDD and the second power source VSS may have different potentials, and the light emitting elements LD may emit light. In an example, the first power source VDD may be set as a high-potential power source, and the second power source VSS may be set as a low-potential power source. A potential difference between the first power source VDD and the second power source VSS may be equal to or higher than a threshold voltage of the light emitting elements LD during an emission period of the pixel PXL.

End portions of the light emitting elements LD constituting each light emitting element EMU may be commonly connected (e.g., electrically connected) to the pixel circuit PXC through an electrode of the light emitting element EMU (e.g., the first electrode ELT1 of each pixel PXL), and be electrically connected to the first power source VDD through the pixel circuit PXL and the first power line PL1. Another end portions of the light emitting elements LD may be commonly connected (e.g., electrically connected) to the second power source VSS through another electrode of the light emitting element EMU (e.g., the second electrode ELT2 of each pixel PXL) and the second power line PL2.

The light emitting elements LD may emit light with a luminance corresponding to a driving current supplied thereto through a corresponding pixel circuit PXC. For example, the pixel circuit PXC may supply a driving current to the light emitting part EMU during each frame period. The driving current supplied by the pixel circuit PXC may correspond to a grayscale value to be expressed in a corresponding frame. The driving current supplied to the light emitting part EMU may be divided, and flow through the light emitting elements connected in the forward direction. Accordingly, the light emitting part EMU may emit light with the luminance corresponding to the driving current, and each light emitting element LD may emit light with a luminance corresponding to a current flowing therethrough.

The pixel circuit PXC may be electrically connected between the first power source VDD and the first electrode ELT1. The pixel circuit PXC may be electrically connected to a scan line Si and a data line Dj of a corresponding pixel PXL. In an example, in case that the pixel PXL is disposed on an ith (where i is a natural number) horizontal line (row) and a jth (where j is a natural number) vertical line (column) of the display area DA, the pixel circuit PXC may be electrically connected to an ith scan line Si and a jth data line Dj.

In an embodiment, the pixel circuit PXC may include transistors T1, T2, and T3 and at least one storage capacitor Cst.

A first transistor T1 may be electrically connected between the first power source VDD and the light emitting part EMU. For example, a first electrode (e.g., drain electrode) of the first transistor T1 may be electrically connected to the first power source VDD, and a second electrode (e.g., a source electrode) of the first transistor T1 may be electrically connected to first electrode ELT1. A gate electrode of the first transistor T1 may be electrically connected to a first node N1. The first transistor T1 may control a driving current supplied to the light emitting part EMU, corresponding to a voltage of the first node N1. For example, the first transistor T1 may control the driving current supplied to the light emitting part EMU based on the voltage of the gate electrode electrically connected to the first node N1. For example, the first transistor T1 may be a driving transistor for controlling the driving current of the pixel PXL.

A second transistor T2 may be electrically connected between the data line Dj and the first node N1. For example, a first electrode of the second transistor T2 may be electrically connected to the data line Dj, and a second electrode of the second transistor T2 may be electrically connected to the first node N1. A gate electrode of the second transistor T2 may be electrically connected to the scan line Si. The second transistor T2 may be turned on in case that a scan signal SSi having a gate-on voltage (e.g., low level voltage) is supplied thereto from the scan line Si. Thus, the second transistor T2 may electrically connect the data line Dj and the first node N1 to each other.

A data signal DSj of the corresponding frame may be supplied to the data line Dj in each frame period. The data signal DSj may be transferred to the first node N1 through the second transistor T2 turned on during a period, in which the scan signal SSi having the gate-on voltage is supplied thereto. For example, the second transistor T2 may be a switching transistor for transferring each data signal DSj to the inside of the pixel PXL.

A third transistor T3 may be electrically connected between the first transistor T1 and a sensing line SLj. For example, an electrode of the third transistor T3 may be electrically connected to the second electrode (e.g., source electrode) of the first transistor T1, which is electrically connected to the first electrode ELT1, and another electrode of the third transistor T3 may be electrically connected to the sensing line SLj. In case that the sensing line SLj is omitted, the another electrode of the third transistor T3 may be electrically connected to the data line Dj.

A gate electrode of the third transistor T3 may be electrically connected to a sensing control line SCLi. In case that the sensing control line SCLi is omitted, the gate electrode of the third transistor T3 may be electrically connected to the scan line Si. The third transistor T3 may be turned on by a sensing control signal SCSi having a gate-on voltage (e.g., a high level voltage), which is supplied to the sensing control line SCLi during a predetermined sensing period, to electrically connect the sensing line SLj and the first transistor T1 to each other.

In an embodiment, the sensing period may be a period for extracting (or sensing) a characteristic (e.g., a threshold voltage of the first transistor T1, or the like) of each of the pixels PXL disposed in the display area DA. During the sensing period, a predetermined reference voltage at which the first transistor T1 can be turned on may be supplied to the first node N1 through the data line Dj and the second transistor T2, or the first transistor T1 may be turned on as each pixel PXL is electrically connected to a current source or the like. In addition, the first transistor T1 may be electrically connected to the sensing line SLj as the third transistor T3 is turned on by supplying the sensing control signal SCSi having the gate-on voltage to the third transistor T3. Subsequently, a sensing signal SENj may be acquired (or generated) through the sensing line SLj, and a characteristic of each pixel PXL, including the threshold voltage of the first transistor T1, or the like, may be detected by using the sensing signal SENj. Information on the characteristic of each pixel PXL may be used to convert image data such that a characteristic deviation between the pixels PXL disposed in the display area DA can be compensated.

An electrode of the storage capacitor Cst may be electrically connected to the second electrode of the first transistor T1, and another electrode of the storage capacitor Cst may be electrically connected to the first node N1. The storage capacitor Cst may charge a voltage corresponding to the data signal DSj supplied to the first node N1 during each frame period.

Although an embodiment in which the first, second, and third transistors T1, T2, and T3 are all n-type transistors has been illustrated in FIG. 5, the disclosure is not limited thereto. For example, at least one of the first, second, and third transistors T1, T2, and T3 may be changed to a P-type transistor.

Although an embodiment in which the effective light sources, e.g., the light emitting elements LD constituting each light emitting element EMU, are all connected in parallel has been illustrated in FIG. 5, the disclosure is not necessarily limited thereto. For example, the light emitting part EMU of each pixel PXL may be configured to include at least two-stage serial structure. Light emitting elements constituting each serial stage may be electrically connected in series to each other by at least one intermediate electrode.

Figure 6:
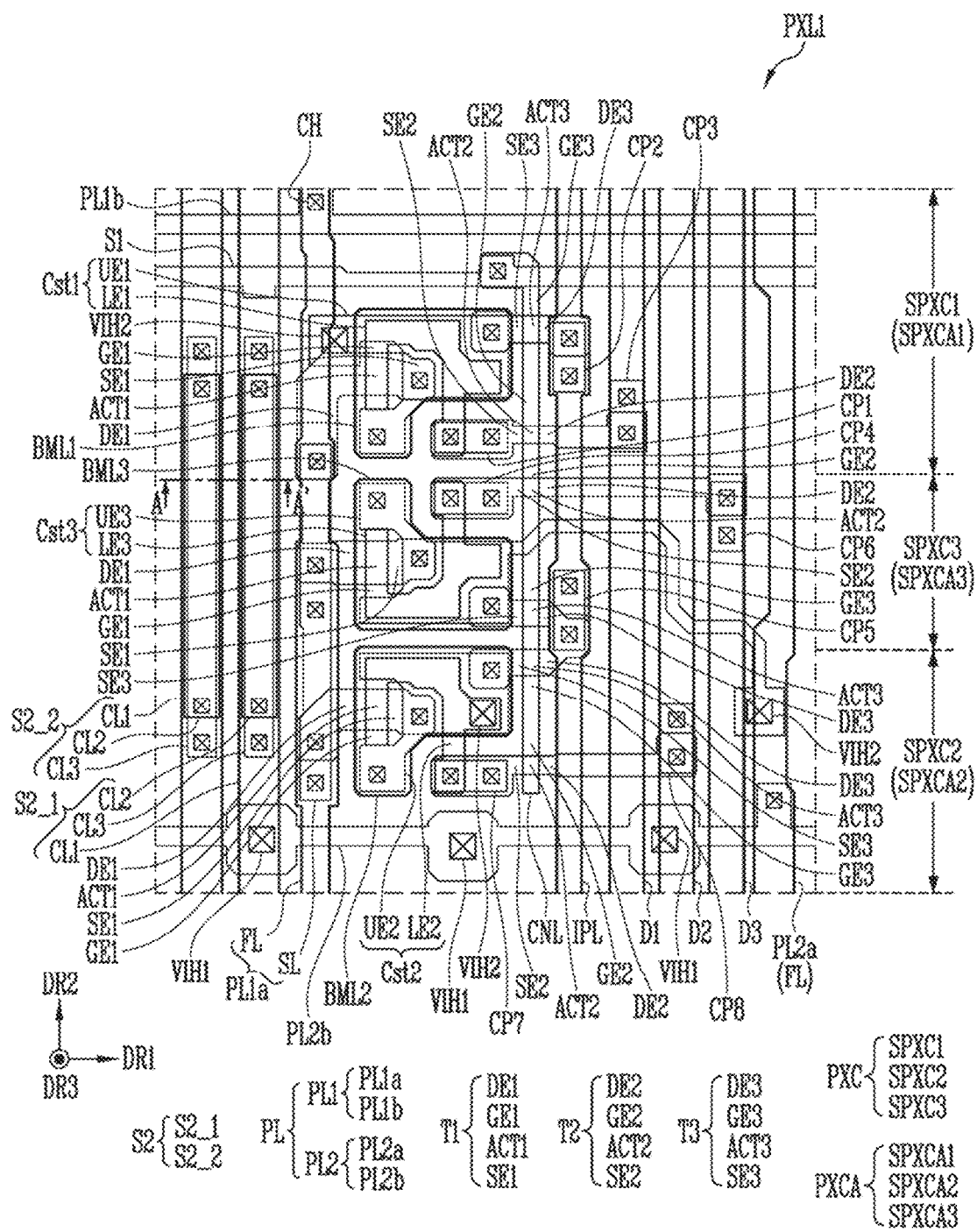
FIG. 6 is a schematic plan view illustrating a circuit layer of a first pixel in accordance with an embodiment of the disclosure.
Figure 7:
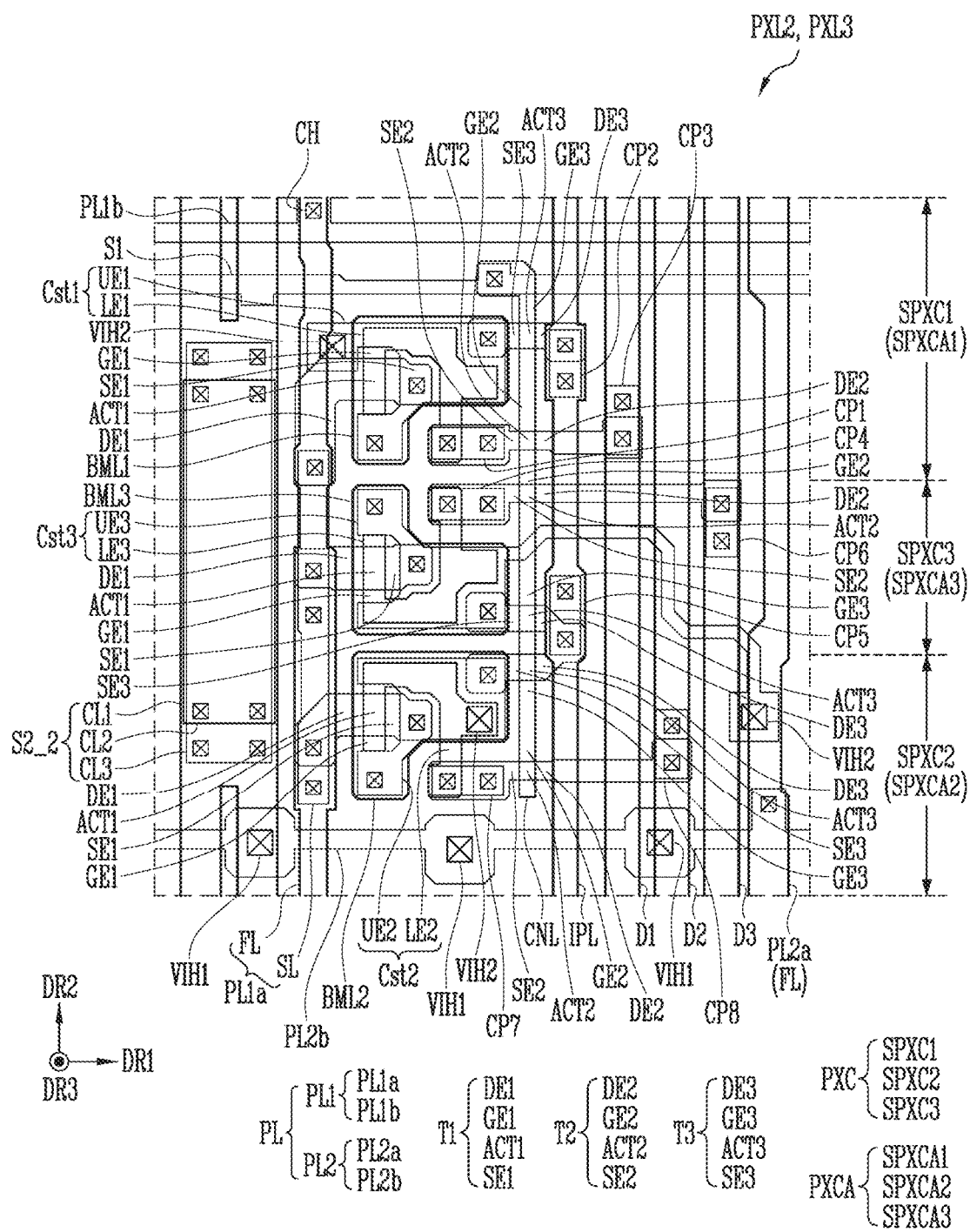
FIG. 7 is a schematic plan view illustrating a circuit layer of a second pixel and/or a third pixel in accordance with an embodiment of the disclosure.
Figure 8:
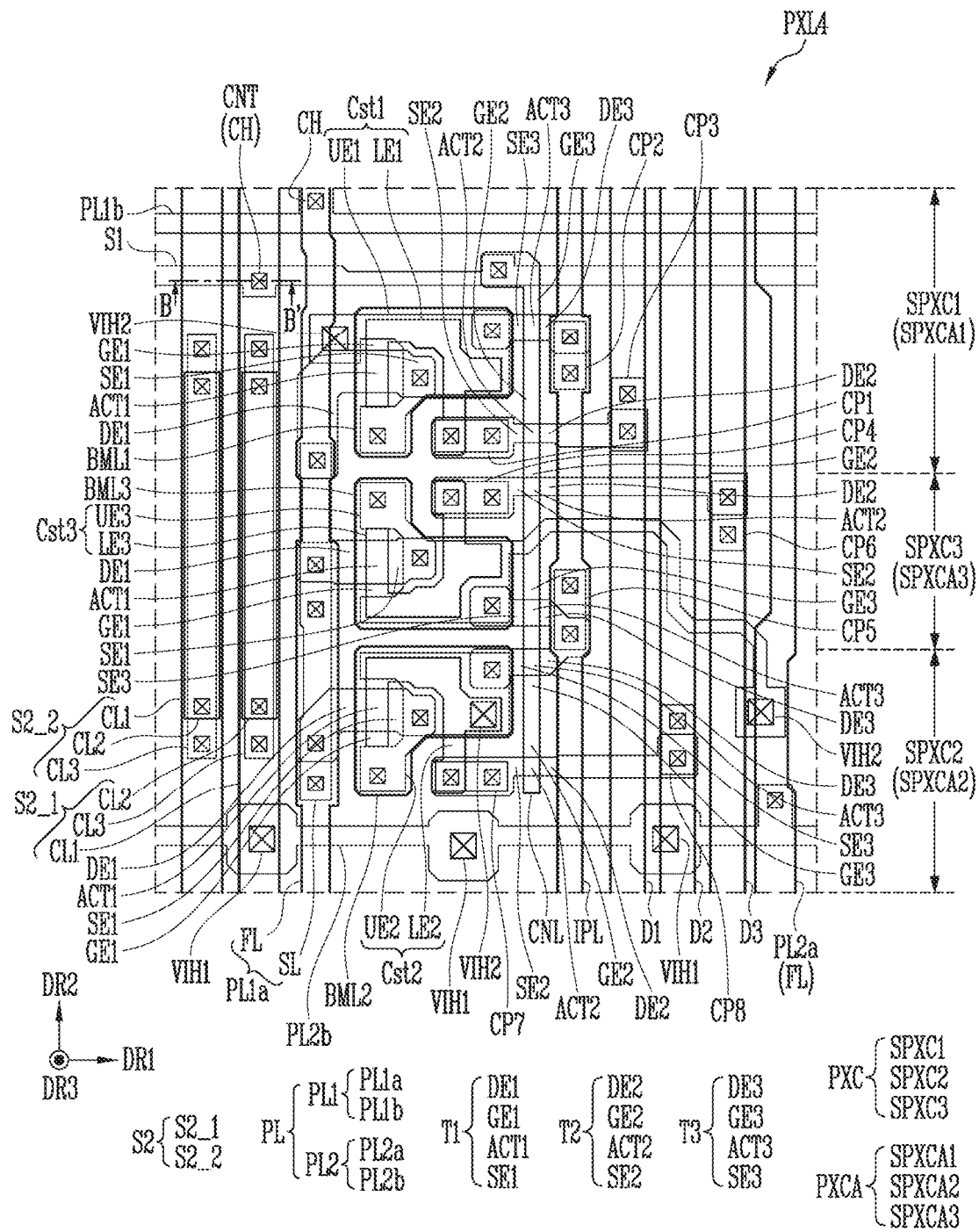
FIGS. 8 and 9 are schematic plan views illustrating a circuit layer of a fourth pixel in accordance with an embodiment of the disclosure.
Figure 9:
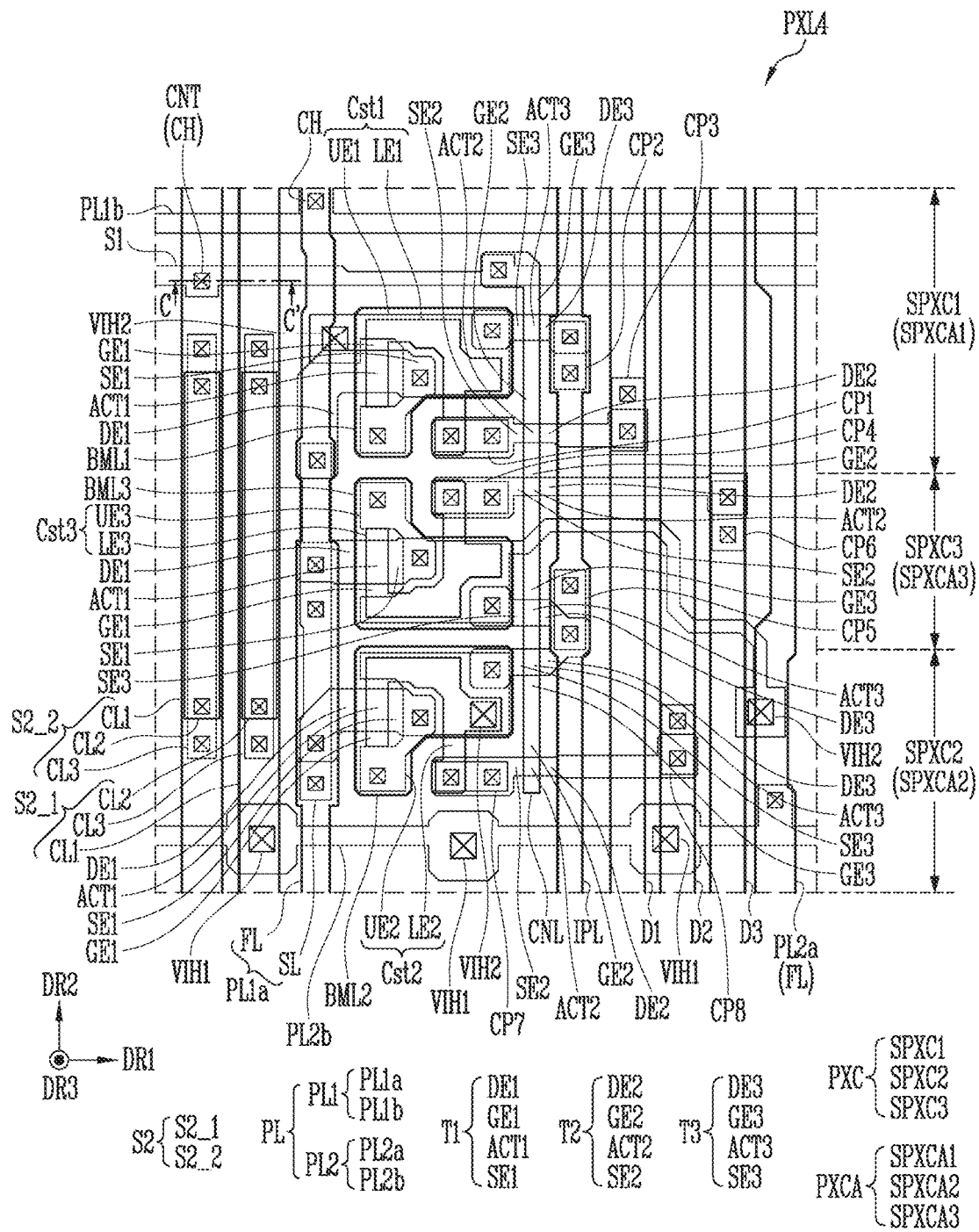
Figure 10:
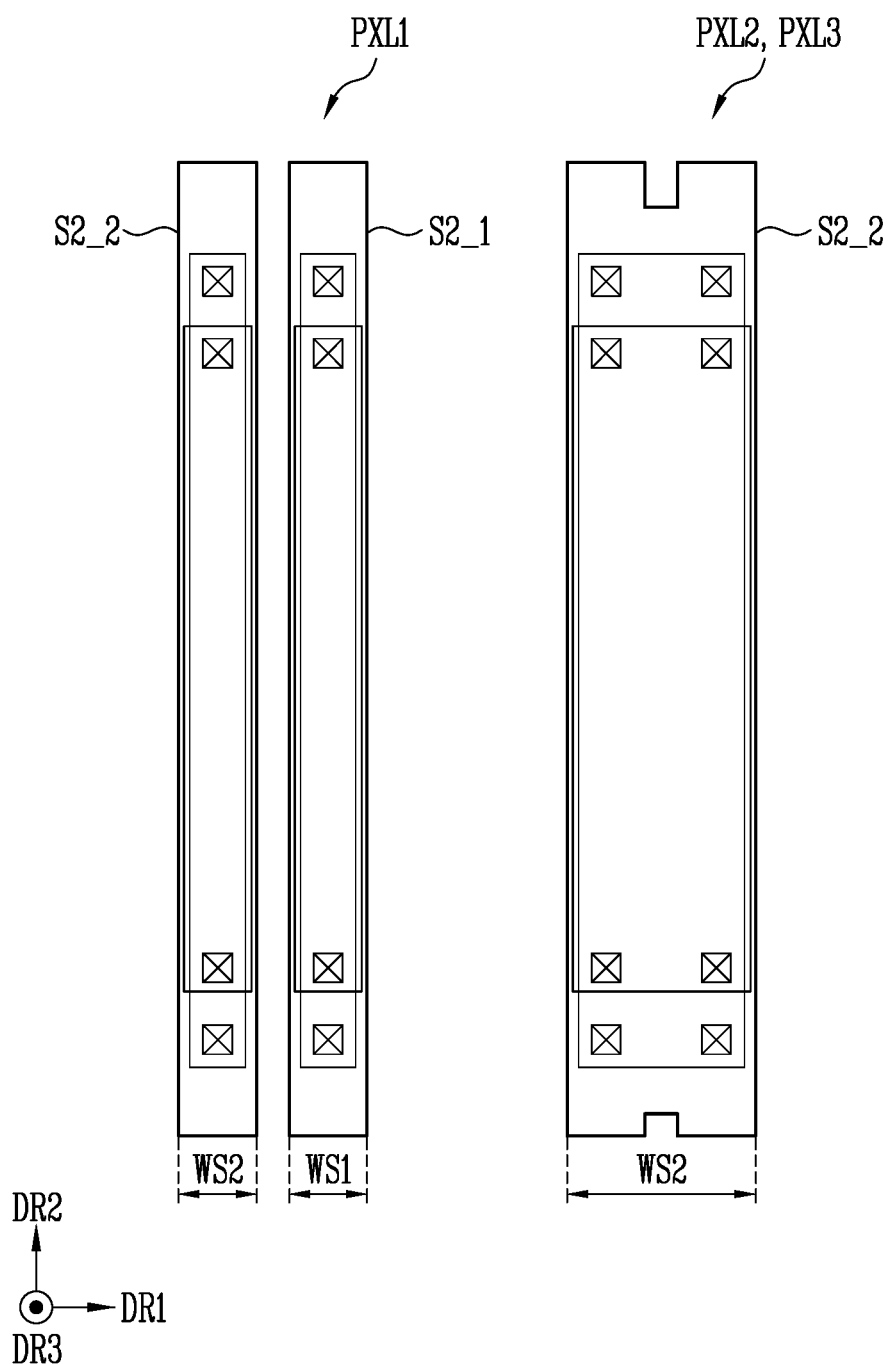
FIG. 10 is a schematic plan view illustrating second scan lines of the first pixel, the second pixel, and/or the third pixel in accordance with an embodiment of the disclosure.
Figure 11:
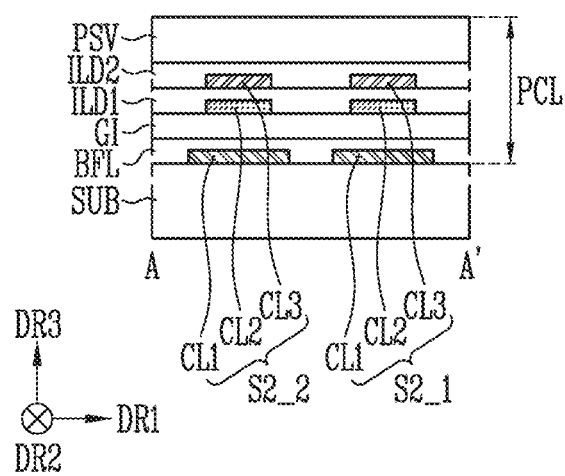
FIG. 11 is a schematic cross-sectional view taken along line A-A' shown in FIG. 6.
Figure 12:
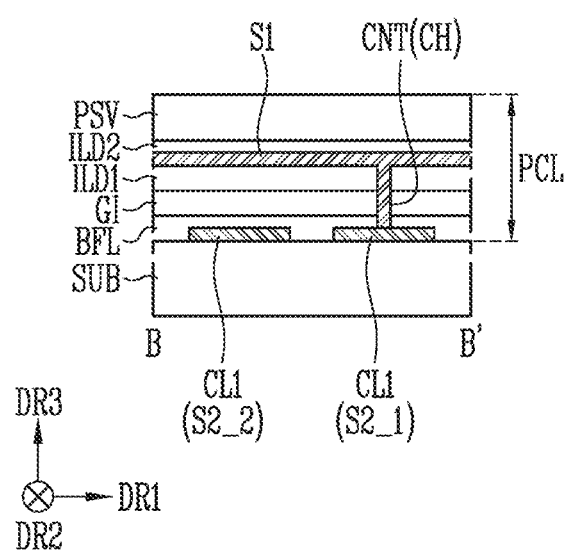
FIG. 12 is a schematic cross-sectional view taken along line B-B' shown in FIG. 8.
Figure 13:
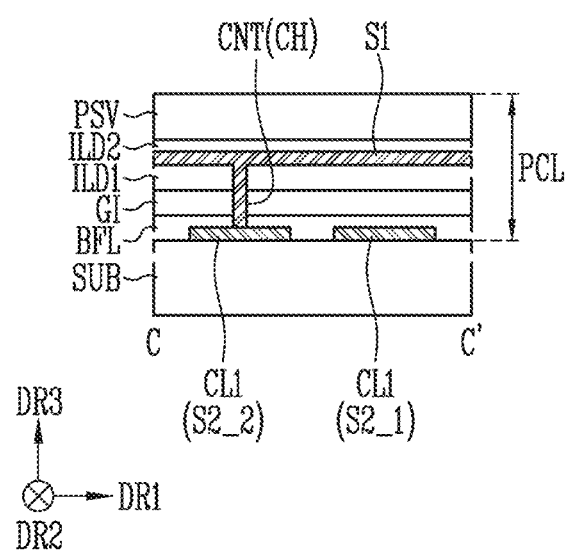
FIG. 13 is a schematic cross-sectional view taken along line C-C' shown in FIG. 9.

FIG. 6 is a schematic plan view illustrating a circuit layer of a first pixel in accordance with an embodiment of the disclosure. FIG. 7 is a schematic plan view illustrating a circuit layer of a second pixel and/or a third pixel in accordance with an embodiment of the disclosure. FIGS. 8 and 9 are schematic plan views illustrating a circuit layer of a fourth pixel in accordance with an embodiment of the disclosure. FIG. 10 is a schematic plan view illustrating second scan lines of the first pixel, the second pixel, and/or the third pixel in accordance with an embodiment of the disclosure. FIG. 11 is a schematic cross-sectional view taken along line A-A' shown in FIG. 6. FIG. 12 is a schematic cross-sectional view taken along line B-B' shown in FIG. 8. FIG. 13 is a schematic cross-sectional view taken along line C-C' shown in FIG. 9.

Referring to FIGS. 6 to 9, each of first to fourth pixels PXL1, PXL2, PXL3, and PXL4 may include a first sub-pixel circuit area SPXCA1, a second sub-pixel circuit area SPXCA2, and a third sub-pixel circuit area SPXCA3. In an example, the second sub-pixel circuit area SPXCA2, the third sub-pixel circuit area SPXCA3, the first sub-pixel circuit area SPXCA1 may be partitioned (e.g., sequentially partitioned) in the second direction DR2.

The first sub-pixel circuit area SPXCA1 may be an area in which a first sub-pixel circuit SPXC1 is provided. The second sub-pixel circuit area SPXCA2 may be an area in which a second sub-pixel circuit SPXC2 is provided. The third sub-pixel circuit area SPXCA3 may be an area in which a third sub-pixel circuit SPXC3 is provided.

A circuit layer PCL (e.g., refer to FIGS. 11 to 13) of each of the first to fourth pixels PXL1, PXL2, PXL3, and PXL4 may include insulating layers and conductive layers, which are disposed on the substrate SUB (e.g., refer to FIGS. 11 to 13). For example, as shown in FIGS. 11 to 13, the insulating layers may include a buffer layer BFL, a gate insulating layer GI, a first interlayer insulating layer ILD1, a second interlayer insulating layer ILD2, and/or a protective layer PSV, which are provided (e.g., sequentially provided) on the substrate SUB. The conductive layers may be provided (or disposed) and/or formed between the above-described insulating layers. The conductive layers may include a first conductive layer provided on the substrate SUB, a second conductive layer provided on the gate insulating layer GI, and/or a third conductive layer provided on the first interlayer insulating layer ILD1. However, the insulating layers and the conductive layers are not limited to the above-described embodiment. In an embodiment, another insulating layer and another conductive layer in addition to the insulating layers and the conductive layers may be provided on the substrate SUB, and some of the insulating layers and the conductive layers may be omitted.

Hereinafter, a configuration of the circuit layer PCL (e.g., refer to FIG. 11) will be described based on the first pixel PXL1.

Referring to FIG. 6, the first pixel PXL1 may include signal lines for transferring a predetermined signal (or predetermined voltage). The signal lines may include a first scan lines S1, a second scan line S2, data lines D1, D2, and D3, a power line PL, and an initialization power line IPL.

The first scan line S1 may extend in the first direction DR1. A scan signal and a control signal may be selectively applied to the first scan line S1. The first scan line S1 of FIG. 6 may correspond to the first scan lines S1 described with reference to FIG. 3.

The first scan line S1 may be electrically connected to a connection line CNL through a contact hole CH. In an example, the first scan line S1 may be electrically connected to the connection line CNL through the contact hole CH penetrating the first interlayer insulating layer ILD1 (e.g., refer to FIG. 11). The first scan line S1 may constitute the third conductive layer provided (or disposed) and/or formed on the first interlayer insulating layer ILD1 (e.g., refer to FIG. 11). The connection line CNL may constitute the second conductive layer provided and/or formed on the gate insulating layer GI (e.g., refer to FIG. 11).

In an embodiment, the connection line CNL may be integrally provided with (or may be integral with) a second gate electrode GE2 of a second transistor T2 of each of the first to third sub-pixel circuits SPXC1, SPXC2, and SPXC3. In an example, a portion of the connection line CNL may be the second gate electrode GE2 of the second transistor T2 of each of the first to third sub-pixel circuits SPXC1, SPXC2, and SPXC3. Accordingly, the connection line CNL may be electrically connected to the second gate electrode GE2 of the second transistor T2 of each of the first to third sub-pixel circuits SPXC1, SPXC2, and SPXC3.

The connection line CNL may be integrally provided with a third gate electrode GE3 of a third transistor T3 of each of the first to third sub-pixel circuits SPXC1, SPXC2, and SPXC3. In an example, another portion of the connection line CNL may be the third gate electrode GE3 of the third transistor T3 of each of the first to third sub-pixel circuits SPXC1, SPXC2, and SPXC3. Accordingly, the connection line CNL may be electrically connected to the third gate electrode GE3 of the third transistor T3 of each of the first to third sub-pixel circuits SPXC1, SPXC2, and SPXC3.

As described above, since the connection line CNL is electrically connected to the first scan line S1 through the contact hole CH, the first scan line S1 may be electrically connected to some components of each of the first to third sub-pixel circuits SPXC1, SPXC2, and SPXC3, e.g., the second and third transistors T2 and T3, through the connection line CNL. The first scan line S1 may supply a scan signal to the second transistor T2 of each of the first to third sub-pixel circuits SPXC1, SPXC2, and SPXC3 during a driving period of light emitting elements LD, and supply a control signal to the third transistor T3 of each of the first to third sub-pixel circuits SPXC1, SPXC2, and SPXC3 during a sensing period.

The connection line CNL may be a common component commonly provided to the first to third sub-pixel circuits SPXC1, SPXC2, and SPXC3. For example, the first to third sub-pixel circuits SPXC1, SPXC2, and SPXC3 may share one connection line CNL.

The data lines D1, D2, and D3 may extend in the second direction DR2, and include a first data line D1, a second data line D2, and a third data line D3, which are arranged (or sequentially arranged) in the first direction. Each of the first to third data lines D1, D2, and D3 may be applied with a corresponding data signal.

The first data line D1 may be electrically connected to the second transistor T2 of the first sub-pixel circuit SPXC1. The second data line D2 may be electrically connected to the second transistor T2 of the second sub-pixel circuit SPXC2. The third data line D3 may be electrically connected to the second transistor T2 of the third sub-pixel circuit SPXC3. The first to third data lines D1, D2, and D3 may constitute the first conductive layer provided on the substrate SUB (e.g., refer to FIG. 11).

The power line PL may include a first power line PL1 and a second power line PL2.

A voltage of the first power source VDD (e.g., refer to FIG. 5) may be applied to the first power line PL1. The first power line PL1 may be the first power line PL1 described with reference to FIG. 5. The first power line PL1 may include a 1ath power line PL1a and a 1bth power line PL1b.

The 1ath power line PL1a may extend in the second direction DR2. In an embodiment, the 1ath power line PL1a may include a first layer FL and a second layer SL. The first layer FL may constitute the first conductive layer provided (or disposed) and/or formed on the substrate SUB (e.g., refer to FIG. 11). The second layer SL may constitute the third conductive layer provided (or disposed) and/or formed on the first interlayer insulating layer ILD1 (e.g., refer to FIG. 11). The first layer FL and the first to third data lines D1, D2, and D3 may be provided in or on a same layer, and the second layer SL and the first scan line S1 may be provided in or on a same layer. The second layer SL may be electrically connected to the first layer FL through at least one contact hole CH. In an example, the second layer SL may be electrically connected to the first layer FL through at least one contact hole CH penetrating the buffer layer BFL (e.g., refer to FIG. 11), the gate insulating layer GI (e.g., refer to FIG. 11), and the first interlayer insulating layer ILD1 (e.g., refer to FIG. 11).

The 1bth power line PL1b may extend in the first direction DR1. The 1bth power line PL1b may constitute the third conductive layer provided and/or formed on the first interlayer insulating layer ILD1 (e.g., refer to FIG. 11). The 1bth power line PL1b, the first scan line S1, and the second layer SL of the 1ath power line PL1a may be provided in a same layer. The 1bth power line PL1b may be spaced apart from the first scan line S1 in a plan view. The 1bth power line PL1b may be electrically connected to the 1ath power line PL1a through a contact hole CH. In an example, the 1bth power line PL1b may be electrically connected to the first layer FL of the 1ath power line PL1a through a contact hole penetrating the buffer layer BFL (e.g., refer to FIG. 11), the gate insulating layer GI (e.g., refer to FIG. 11), and the first interlayer insulating layer ILD1 (e.g., refer to FIG. 11).

A voltage of the second power source VSS (e.g., refer to FIG. 5) may be applied to the second power line PL2. The second power line PL2 may be the second power line PL2 described with reference to FIG. 5. The second power line PL2 may include a 2ath power line PL2a and a 2bth power line PL2b.

The 2ath power line PL2a may extend in the second direction DR2. The 2ath power line PL2a may be implemented in (or implemented with) a single-layer structure including a first layer FL. The first layer FL may constitute the first conductive layer provided (or disposed) and/or formed on the substrate SUB (e.g., refer to FIG. 11). The first layer FL, the first to third data lines D1, D2, and D3, and the first layer FL of the 1ath power line PL1a may be provided in a same layer. The first layer FL may be spaced apart from the first to third data lines D1, D2, and D3 and the 1ath power line PL1a in a plan view.

The 2ath power line PL2a and the 2bth power line PL2b may be electrically connected to each other through a contact hole CH. In an example, the 2bth power line PL2b may be electrically connected to the 2ath power line PL2a through a contact hole CH penetrating the buffer layer BFL (e.g., refer to FIG. 11), the gate insulating layer GI (e.g., refer to FIG. 11), and the first interlayer insulating layer ILD1 (e.g., refer to FIG. 11).

The second scan line S2 may extend in the second direction DR2. In the first pixel PXL1, the second scan line S2 may intersect the first scan line S1, and at least partially overlap the first scan line S1 in a plan view. The second scan line S2 may be a signal line which is electrically connected to a driving part (not shown) located at a side of the non-display area NDA of the substrate SUB, and a scan signal and a control signal from the driving part may be selectively supplied to the second scan line S2.

The second scan line S2 may include a first sub-scan line S2_1 and a second sub-scan line S2_2.

Each of the first sub-scan line S2_1 and the second sub-scan line S2_2 may be configured with conductive layers. For example, as shown in FIG. 11, each of the first sub-scan line S2_1 and the second sub-scan line S2_2 may be implemented in a triple-layer structure including a first conductive layer CL1, a second conductive line CL2, and a third conductive line CL3. In an example, the first conductive line CL1 may constitute the first conductive layer provided and/or formed on the substrate SUB. The second conductive line CL2 may constitute the second conductive layer provided and/or formed on the gate insulating layer GI. The third conductive line CL3 may constitute the third conductive layer provided and/or formed on the first interlayer insulating layer ILD1.

The third conductive line CL3 may be electrically connected to the first conductive line CL1 and the second conductive line CL2 through a contact hole CH. In an example, the third conductive line CL1 may be electrically connected to the first conductive line CL1 through a contact hole CH penetrating the buffer layer BFL (e.g., refer to FIG. 11), the gate insulating layer GI (e.g., refer to FIG. 11), and the first interlayer insulating layer ILD1 (e.g., refer to FIG. 11). The third conductive line CL3 may be electrically connected to the second conductive line CL2 through a contact hole CH penetrating the first interlayer insulating layer ILD1 (e.g., refer to FIG. 11). Accordingly, the first conductive line CL1 and the second conductive line CL2 may be electrically connected to each other through the third conductive line CL3. The first conductive line CL1, the second conductive line CL2, and the third conductive line CL3 may overlap each other in the third direction DR3.

In the above-described embodiment, it has been described that each of the first sub-scan line S2_1 and the second sub-scan line S2_2 is implemented in the triple-layer structure including the first conductive line CL1, a second conductive line CL2, and the third conductive line CL3. However, the disclosure is not limited thereto. In an embodiment, each of the first sub-scan line S2_1 and the second sub-scan line S2_2 may be implemented in a single-layer structure, a double-layer structure, or a multi-layer structure including three or more layers.

In an embodiment, the first conductive line CL1 of the second sub-scan line S2_2 may be provided in (e.g., commonly provided in) some of pixels PXL located on the same pixel column as the first pixel PXL1 in the second direction DR2. For example, the pixels PXL located on the same pixel column as the first pixel PXL1 in the second direction DR2 may share the first conductive line CL1 of the second sub-scan line S2_2.

In an embodiment, the first conductive line CL1 of the first sub-scan line S2_1 may not be provided in second pixels PXL2 and third pixels PXL3, which are located on the same pixel column as the first pixel PXL1 in the second direction DR2. For example, the first conductive line CL1 of the first sub-scan line S2_1 may not overlap a second pixel area A2 (e.g., refer to FIG. 3) and/or a third pixel area A3 (e.g., refer to FIG. 3) in a plan view, which are located on the same pixel column as the first pixel PXL1 in the second direction DR2. For example, the second pixels PXL2 and the third pixels PXL3, which are located on the same pixel column as the first pixel PXL1 in the second direction DR2, may not share the first conductive line CL1 of the first sub-scan line S2_1.

In the first pixel PXL1, the first sub-scan line S2_1 and/or the second sub-scan line S2_2 may not be directly connected to (or may be separated from) the first scan line S1. For example, in the first pixel PXL1, the first scan line S1 may not be in direct contact with (or may not directly contact) the first sub-scan line S2_1 and/or the second sub-scan line S2_2.

The first pixel PXL1 may be commonly connected (e.g., electrically connected) to the same first scan line S1 as a fourth pixel PXL4 located on the same pixel row in the first direction DR1. For example, the first pixel PXL1 and the fourth pixel PXL4 located on the same pixel row in the first direction DR1 may be commonly connected (e.g., electrically connected) to the same first scan line S1. The first scan line S1 may be electrically connected to the second scan line S2 through a contact part CNT in the fourth pixel PXL4. For example, a predetermined signal provided from the second scan line S2 may be supplied to each of the first to third sub-pixel circuits SPXC1, SPXC2, and SPXC3 through the contact part CNT.

The first sub-scan line S2_1 of the first pixel PXL1 may be electrically connected to a first sub-scan line S2_1 of a fourth pixel PXL4 located on the same pixel column in the second direction DR2. Accordingly, the first sub-scan line S2_1 of the first pixel PXL1 may transfer a predetermined signal provided from the driving part to the fourth pixel PXL4 via a corresponding pixel.

In accordance with the above-described embodiment, the first scan line S1 of the first pixel PXL1 may receive a predetermined signal transferred from the fourth pixel PXL4 located on the same pixel row in the first direction DR1. The second scan line S2 of the first pixel PXL1 may transfer a predetermined signal transferred from the driving part to the fourth pixel PXL4 located on the same pixel column in the second direction DR2 through the contact part CNT. Accordingly, although the first scan line S1 and the second scan line S2 in the first pixel PXL1 are not in direct contact with each other because the first scan line S1 and the second scan line S2 are not provided with the contact part CNT, the first scan line S1 and the second scan line S2 may be used as scan lines SC for transferring a predetermined signal supplied from the driving part to the corresponding pixel and the fourth pixel PXL4.

The initialization power line IPL may extend in the second direction DR2, and be disposed between the 1ath power line PL1a and the first data line D1 in a plan view. The initialization power line IPL may be the jth sensing line SLj described with reference to FIG. 5. A voltage of an initialization power source may be applied to the initialization power line IPL. In an embodiment, the initialization power line IPL may constitute the first conductive layer provided and/or formed on the substrate SUB (e.g., refer to FIG. 11).

The initialization power line IPL may be electrically connected to the third transistor T3 of the first sub-pixel circuit SPXC1 through a second conductive pattern CP2, and be electrically connected to the third transistor T3 of each of the second and third sub-pixel circuits SPXC2 and SPXC3 through a fifth conductive pattern CP5.

The second conductive pattern CP2 may constitute the third conductive layer provided and/or formed on the first interlayer insulating layer ILD1 (e.g., refer to FIG. 11).

One end (or first end) of the second conductive pattern CP2 may be electrically connected to the initialization power line IPL through a contact hole CH. In an example, the one end of the second conductive pattern CP2 may be electrically connected to the initialization power line IPL through a contact hole CH penetrating the buffer layer BFL, the gate insulating layer GI, and the first interlayer insulating layer ILD1.

The other end (or second) of the second conductive pattern CP2 may be electrically connected to the third transistor T3 of the first sub-pixel circuit SPXC1 through another contact hole CH. In an example, the other end of the second conductive pattern CP2 may be electrically connected to a third drain region DE3 of the third transistor T3 of the first sub-pixel circuit SPXC1 through a contact hole CH penetrating the gate insulating layer GI and the first interlayer insulating layer ILD1.

The fifth conductive pattern CP5 may constitute the third conductive layer provided and/or formed on the first interlayer insulating layer ILD1.

One end (or first end) of the fifth conductive pattern CP5 may be electrically connected to the initialization power line IPL through a contact hole CH. In an example, the one end of the fifth conductive pattern CP5 may be electrically connected to the initialization power line IPL through a contact hole CH penetrating the buffer layer BFL, the gate insulating layer GI, and the first interlayer insulating layer ILD1.

The other end (or second end) of the fifth conductive pattern CP5 may be electrically connected to the third transistor T3 of each of the second and third sub-pixel circuits SPXC2 and SPXC3 through another contact hole CH. In an example, the other end of the fifth conductive pattern CP5 may be electrically connected to a third drain region DE3 of the third transistor T3 of each of the second and third sub-pixel circuits SPXC2 and SPXC3 through a contact hole CH penetrating the gate insulating layer GI and the first interlayer insulating layer ILD1.

For example, the first power line PL1, the second power line PL2, the initialization power line IPL, the connection line CNL, the first scan line S1, and the second scan line S2, which are described above, may be common components commonly provided in the first to third sub-pixel circuits SPXC1, SPXC2, and SPXC3.

Each of the first to third sub-pixel circuits SPXC1, SPXC2, and SPXC3 may include a first transistor T1, a second transistor T2, a third transistor T3, and a storage capacitor. In an example, the first sub-pixel circuit SPXC1 may include first to third transistors T1, T2, and T3 and a first storage capacitor Cst1. The second sub-pixel circuit SPXC2 may include first to third transistors T1, T2, and T3 and a second storage capacitor Cst2. The third sub-pixel circuit SPXC3 may include first to third transistors T1, T2, and T3 and a third storage capacitor Cst3. The first transistor T1 of each of the first to third sub-pixel circuits SPXC1, SPXC2, and SPXC3 may be the first transistor T1 described with reference to FIG. 5. The second transistor T2 of each of the first to third sub-pixel circuits SPXC1, SPXC2, and SPXC3 may be the second transistor T2 described with reference to FIG. 5. The third transistor T3 of each of the first to third sub-pixel circuits SPXC1, SPXC2, and SPXC3 may be the third transistor T3 described with reference to FIG. 5.

The first sub-pixel circuit SPXC1, the second sub-pixel circuit SPXC2, and the third sub-pixel circuit SPXC3 may have structures substantially similar or identical to one another. Hereinafter, the first sub-pixel circuit SPXC1 among the first to third sub-pixel circuits SPXC1, SPXC2, and SPXC3 will be mainly described, and the second and third sub-pixel circuits SPXC2 and SPXC3 will be briefly described.

The first sub-pixel circuit SPXC1 may include the first transistor T1, the second transistor T2, the third transistor T3, and the first storage capacitor Cst1.

The first transistor T1 may include a first gate electrode GE1, a first active pattern ACT1, a first source region SE1, and a first drain region DE1.

The first gate electrode GE1 may be electrically connected to a second source region SE2 of the second transistor T2 through a first conductive pattern CP1. The first gate electrode GE1 may constitute the second conductive layer provided and/or formed on the gate insulating layer GI (e.g., refer to FIG. 11).

The first conductive pattern CP1 may constitute the third conductive layer. One end (or first end) of the first conductive pattern CP1 may be electrically connected to the first gate electrode GE1 through a contact hole CH. In an example, the one end of the first conductive pattern CP1 may be electrically connected to the first gate electrode GE1 through a contact hole CH penetrating the first interlayer insulating layer ILD1. The other end (or second end) of the first conductive pattern CP1 may be electrically connected to the second source region SE2 through another contact hole CH. In an example, the other end of the first conductive pattern may be electrically connected to the second source region SE2 through a contact hole penetrating the gate insulating layer GI and the first interlayer insulating layer ILD1.

Each of the first active pattern ACT1, the first source region SE1, and the first drain region DE1 may be an active pattern made of poly-silicon, amorphous silicon, an oxide semiconductor, or the like. Each of the first active pattern ACT1, the first source region SE1, and the first drain region DE1 may be formed with or implemented with, for example, an undoped semiconductor layer or a semiconductor layer doped with an impurity. In an example, each of the first source region SE1 and the first drain region DE1 may be formed with or implemented with, for example, a semiconductor layer doped with the impurity, and the first active pattern ACT1 may be formed with or implemented with, for example, an undoped semiconductor layer without impurity. The impurity doped in the semiconductor layer of each of the first source region SE1 and the first drain region DE1 may include, for example, an n-type impurity.

The first active pattern ACT1, the first source region SE1, and the first drain region DE1 may be provided and/or formed on the buffer layer BFL. The first active pattern ACT1 may be a region overlapping the first gate electrode GE1 in a plan view, and may be a channel region of the first transistor T1. The first source region SE1 may be electrically connected to (or in contact with) an end of the first active pattern ACT1. The first source region SE1 may be electrically connected to a first bottom metal layer BML1 through a contact hole CH penetrating the buffer layer BFL.

The first bottom metal layer BML1 may constitute the first conductive layer provided and/or formed on the substrate SUB (e.g., refer to FIG. 11). The first bottom metal layer BML1 may be electrically connected to the first source region SE1 through a contact hole CH. In case that the first bottom metal layer BML1 is electrically connected to the first transistor T1 of the first sub-pixel circuit SPXC1, a swing width margin of the second power source VSS may be further secured. The driving range of a predetermined voltage supplied to the first gate electrode GE1 of the first transistor T1 of the first sub-pixel circuit SPXC1 may be widened.

The first drain region DE1 may be electrically connected to (or in contact with) the other end of the first active pattern ACT1. The first drain region DE1 may be electrically connected to the 1ath power line PL1a through a contact hole CH. In an example, the first drain region DE1 may be electrically connected to the first layer FL of the 1ath power line PL1a through a contact hole CH penetrating the buffer layer BFL.

The second transistor T2 may include a second gate electrode GE2, a second active pattern ACT2, the second source region SE2, and a second drain region DE2.

The second gate electrode GE2 and the connection line CNL may be integral with each other. The second gate electrode GE2 may be a region (or a portion) of the connection line CNL. As described above, the connection line CNL may be electrically connected to the first scan line S1 through the corresponding contact hole CH, and therefore, a predetermined signal (e.g., a scan signal) applied to the first scan line S1 may be finally supplied to the second gate electrode GE2.

Each of the second active pattern ACT2, the second source region SE2, and the second drain region DE2 may be an active pattern made of poly-silicon, amorphous silicon, an oxide semiconductor, or the like. Each of the second active pattern ACT2, the second source region SE2, and the second drain region DE2 may be formed with or implemented with, for example, an undoped semiconductor layer or a semiconductor layer doped with an impurity. In an example, each of the second source region SE2 and the second drain region DE2 may be formed with or implemented with, for example, a semiconductor layer doped with the impurity, and the second active pattern ACT2 may be formed with or implemented with, for example, an undoped semiconductor layer without impurity. The impurity doped in the semiconductor layer of each of the second source region SE2 and the second drain region DE2 may include, for example, an n-type impurity.

The second active pattern ACT2, the second source region SE2, and the second drain region DE2 may be provided and/or formed on the buffer layer BFL. The second active pattern ACT2 is a region overlapping the second gate electrode GE2 in a plan view, and may be a channel region of the second transistor T2. The second source region SE2 may be electrically connected to (or in contact with) an end of the second active pattern ACT2. The second source region SE2 may be electrically connected to the first gate electrode GE1 through the first conductive pattern CP1.

The second drain region DE2 may be electrically connected to (or in contact with) the other end of the second active pattern ACT2. The second drain region DE2 may be electrically connected to the first data line D1 through a third conductive pattern CP3.

The third conductive pattern CP3 may constitute the third conductive layer provided and/or formed on the first interlayer insulating layer ILD1. One end (or first end) of the third conductive pattern CP3 may be electrically connected to the first data line D1 through a contact hole CH penetrating the buffer layer BFL, the gate insulating layer GI, and the first interlayer insulating layer ILD1. The other end (or second end) of the third conductive pattern CP3 may be electrically connected to the second drain region DE2 through a contact hole CH penetrating the gate insulating layer GI and the first interlayer insulating layer ILD1. The second drain region DE2 and the first data line D1 may be electrically connected to each other through the third conductive pattern CP3.

The third transistor T3 may include a third gate electrode GE3, a third active pattern ACT3, a third source region SE3, and a third drain region DE3.

The third gate electrode GE3 and the connection line CNL may be integral with each other. The third gate electrode GE3 may be another region of the connection line CNL. As described above, the connection line CNL may be electrically connected to the first scan line S1 through the corresponding contact hole CH1, and therefore, a predetermined signal (e.g., a control signal) applied to the first scan line S1 may be finally supplied to the third gate electrode GE3.

Each of the third active pattern ACT3, the third source region SE3, and the third drain region DE3 may be an active pattern made of poly-silicon, amorphous silicon, an oxide semiconductor, or the like. Each of the third active pattern ACT3, the third source region SE3, and the third drain region DE3 may be formed with or implemented with, for example, a semiconductor undoped or doped with an impurity. In an example, each of the third source region SE3 and a third drain region DE3 may be formed with or implemented with, for example, a semiconductor layer doped with the impurity, and the third active pattern ACT3 may be formed with or implemented with, for example, an undoped semiconductor layer not doped with the impurity. The impurity doped in the semiconductor layer of each of the third source region SE3 and a third drain region DE3 may include, for example, an n-type impurity.

The third active pattern ACT3, the third source region SE3, and the third drain region DE3 may be provided and/or formed on the buffer layer BFL. The third active pattern ACT3 may be a region overlapping the third gate electrode GE3 in a plan view, and may be a channel region of the third transistor T3. The third source region SE3 may be electrically connected to (or in contact with) an end of the third active pattern ACT3. The third source region SE3 may be electrically connected to the first bottom metal layer BML1 through a contact hole CH penetrating the buffer layer BFL.

The third drain region DE3 may be electrically connected to (or in contact with) the another end of the third active pattern ACT3. The third drain region DE3 may be electrically connected to the initialization power line IPL through the second conductive pattern CP2.

The first storage capacitor Cst1 may include a first lower electrode LE1 and a first upper electrode UE1. The first storage capacitor Cst1 may be the storage capacitor Cst described with reference to FIG. 5.

The first lower electrode LE1 and the first gate electrode GE1 may be integral with each other. The first lower electrode LE1 may be a region (or portion) of the first gate electrode GE1.

The first upper electrode UE1 may overlap the first lower electrode LE1 in a plan view, and have a size (or area) greater than that of the first lower electrode LE1. However, the disclosure is not limited thereto. The first upper electrode UE1 may overlap each of the first source region SE1 and the third source region SE3 in a plan view. The first upper electrode UE1 may constitute the third conductive layer provided and/or formed on the first interlayer insulating layer ILD1.

The first upper electrode UE1 may be electrically connected to the first bottom metal layer BML1 through a contact hole penetrating the buffer layer BFL, the gate insulating layer GI, and the first interlayer insulating layer ILD1. As described above, the first source region SE1 and the third source region SE3 may be electrically connected to the first bottom metal layer BML1, and therefore, the first upper electrode UE1 may be electrically connected to the first and third source regions SE1 and SE3 through the first bottom metal layer BML1.

The second sub-pixel circuit SPXC2 may include the first transistor T1, the second transistor T2, the third transistor T3, and the second storage capacitor Cst2.

The first transistor T1 may include a first gate electrode GE1, a first active pattern ACT1, a first source region SE1, and a first drain electrode DE1.

The first gate electrode GE1 may be electrically connected to a second source region SE2 of the second transistor T2.

The first active pattern ACT1 may be a channel region of the first transistor T1.

The first source region SE1 may be electrically connected to the first active pattern ACT1. The first source region SE1 may be electrically connected to a second bottom metal layer BML2 through a contact hole CH penetrating the buffer layer BFL.

The second bottom metal layer BML2 may be a component corresponding to the first bottom metal layer BML1. The second bottom metal layer BML2 may constitute the first conductive layer provided and/or formed on the substrate SUB. The second bottom metal layer BML2 may be electrically connected to the first source region SE1 through the corresponding contact hole CH. The second bottom metal layer BML2 may be electrically connected to a third source region SE3 through another contact hole CH penetrating the buffer layer BFL. The second bottom metal layer BML2 may be electrically connected to a second upper electrode UE2 through still another contact hole CH penetrating the buffer layer BFL, the gate insulating layer GI, and the first interlayer insulating layer ILD1.

The first drain region DE1 may be electrically connected to the first active pattern ACT1. The first drain region DE1 may be electrically connected to the first layer FL of the 1ath power line PL1a through another contact hole CH penetrating the buffer layer BFL.

The second transistor T2 may include a second gate electrode GE2, a second active pattern ACT2, the second source region SE2, and a second drain region DE2.

The second gate electrode GE2 and the connection line CNL may be integral with each other, and the second gate electrode GE may be electrically connected to the first scan line S1.

The second active pattern ACT2 may be a channel region of the second transistor T2.

The second source region SE2 may be electrically connected to the second active pattern ACT2. The second source region SE2 may be electrically connected to the first gate electrode GE1 through a seventh conductive pattern CP7.

The seventh conductive pattern CP7 may constitute the third conductive layer provided and/or formed on the first interlayer insulating layer ILD1. One end (or first end) of the seventh conductive pattern CP7 may be electrically connected to the second source region SE2 through a contact hole CH penetrating the gate insulating layer GI and the first interlayer insulating layer ILD1. The other end (or second end) of the seventh conductive pattern CP7 may be electrically connected to the first gate electrode GE1 through a contact hole penetrating the first interlayer insulating layer ILD1.

The second drain region DE2 may be electrically connected to the second active pattern ACT2. The second drain region DE2 may be electrically connected to the second data line D2 through an eighth conductive pattern CP8.

The eighth conductive pattern CP8 may be the conductive layer provided and/or formed on the first interlayer insulating layer ILD1. One end (or first end) of the eighth conductive pattern CP8 may be electrically connected to the second data line D2 through a contact hole CH penetrating the buffer layer BFL, the gate insulating layer GI, and the first interlayer insulating layer ILD1. The other end (or second end) of the eighth conductive pattern CP8 may be electrically connected to the second drain region DE2 through a contact hole CH penetrating the gate insulating layer GI and the first interlayer insulating layer ILD1.

The third transistor T3 may include a third gate electrode GE3, a third active pattern ACT3, the third source region SE3, and a third drain region DE3.

The third gate electrode GE3 and the connection line CNL may be integral with each other, and the third gate electrode GE3 may be electrically connected to the first scan line S1.

The third active pattern ACT3 may be a channel region of the third transistor T3.

The third source region SE3 may be electrically connected to the third active pattern ACT3. The third source region SE3 may be electrically connected to the second bottom metal layer BML2 through a contact hole CH.

The third drain region DE3 may be electrically connected to the third active pattern ACT3. The third drain region DE3 may be electrically connected to the initialization power line IPL through the fifth conductive pattern CP5.

The second storage capacitor Cst2 may have a structure substantially identical or similar to that of the first storage capacitor Cst1 of the first sub-pixel circuit SPXC1. In an example, the second storage capacitor Cst2 may include a second lower electrode LE2 and the second upper electrode UE2.

The second lower electrode LE2 may constitute the second conductive layer. The second lower electrode LE2 and a corresponding transistor (e.g., first gate electrode GE of second transistor T2) may be integral with each other. The second upper electrode UE2 may constitute the third conductive layer, and overlap the second lower electrode LE2 in a plan view. The second upper electrode UE2 may be electrically connected to the second bottom metal layer BML2 through the corresponding contact hole CH.

As described above, the second upper electrode UE2 may be electrically connected to each of the first source region SE1 and the third source region SE3 through the second bottom metal layer BML2.

The third sub-pixel circuit SPXC3 may include the first transistor T1, the second transistor T2, the third transistor T3, and the third storage capacitor Cst.

The first transistor T1 may include a first gate electrode GE1, a first active pattern ACT1, a first source region SE1, and a first drain electrode DE1.

The first gate electrode GE1 may be electrically connected to a third source region SE3 of the third transistor T3.

The first active pattern ACT1 may be a channel region of the first transistor T1.

The first source region SE1 may be electrically connected to the first active pattern ACT1. The first source region SE1 may be electrically connected to a third bottom metal layer BML3 through a contact hole CH penetrating the buffer layer BFL.

The third bottom metal layer BML3 may be a component corresponding to each of the first and second bottom metal layers BML1 and BML2. The third bottom metal layer BML3 may constitute the first conductive layer. The third bottom metal layer BML3 may be electrically connected to the first source region SE1 through a contact hole CH. The third bottom metal layer BML3 may be electrically connected to the third source region SE3 of the third transistor T3 through another contact hole CH penetrating the buffer layer BFL. The third bottom metal layer BML3 may be electrically connected to a third upper electrode UE3 through still another contact hole CH penetrating the buffer layer BFL, the gate insulating layer GI, and the first interlayer insulating layer ILD1.

The first drain region DE1 may be electrically connected to the first active pattern ACT1. The first drain region DE1 may be electrically connected to the first layer FL of the 1ath power line PL1$a$ through still another contact hole CH penetrating the buffer layer BFL.

The second transistor T2 may include a second gate electrode GE2, a second active pattern ACT2, a second source region SE2, and a second drain region DE2.

The second gate electrode GE2 and the connection line CNL may be integral with each other, and the second gate electrode GE2 may be electrically connected to the first scan line S1.

The second active pattern ACT2 may be a channel region of the second transistor T2.

The second source region SE2 may be electrically connected to the second active pattern ACT2. The second source region SE2 may be electrically connected to the first gate electrode GE1 through a fourth conductive pattern CP4.

The fourth conductive pattern CP4 may constitute the third conductive layer provided and/or formed on the first interlayer insulating layer ILD1. One end (or first end) of the fourth conductive pattern CP4 may be electrically connected to the second source region SE2 through a contact hole CH penetrating the gate insulating layer GI and the first interlayer insulating layer ILD1. The other end (or second end) of the fourth conductive pattern CP4 may be electrically connected to the first gate electrode GE1 through a contact hole CH penetrating the first interlayer insulating layer ILD1. Therefore, the first gate electrode GE1 and the second source region SE2 may be electrically connected to each other through the fourth conductive pattern CP4.

The second drain region DE2 may be electrically connected to the second active pattern ACT2. The second drain region DE2 may be electrically connected to the third data line D3 through a sixth conductive pattern CP6.

The sixth conductive pattern CP6 may constitute the third conductive layer provided and/or formed on the first interlayer insulating layer ILD1. One end (or first end) of the sixth conductive pattern CP6 may be electrically connected to the third data line D3 through a contact hole CH penetrating the buffer layer BFL, the gate insulating layer GI, and the first interlayer insulating layer ILD1. The other end (or second end) of the sixth conductive pattern CP6 may be electrically connected to the second drain region DE2 through a contact hole CH penetrating the gate insulating layer GI and the first interlayer insulating layer ILD1. Therefore, the second drain region DE2 and the third data line D3 may be electrically connected to each other through the sixth conductive pattern CP6.

The third transistor T3 of the third sub-pixel circuit SPXC3 may include a third gate electrode GE3, a third active pattern ACT3, the third source region SE3, and a third drain region DE3.

The third gate electrode GE3 and the connection line CNL may be integral with each other, and the third gate electrode GE3 may be electrically connected to the first scan line S1.

The third active pattern ACT3 may be a channel region of the third transistor T3.

The third source region SE3 may be electrically connected to the third active pattern ACT3. The third source region SE3 may be electrically connected to the third bottom metal layer BML3 through the corresponding contact hole CH.

The third drain region DE3 may be electrically connected to the third active pattern ACT3. The third drain region DE3 may be electrically connected to the initialization power line IPL through the fifth conductive pattern CP5. In an embodiment, the third drain region DE3 of the third transistor T3 and the second drain region DE2 of the second transistor T2 may share the fifth conductive pattern CP5.

The third storage capacitor Cst3 may have a structure substantially identical or similar to that of each of the first and second storage capacitors Cst1 and Cst2. In an example, the third storage capacitor Cst3 may include a third lower electrode LE3 and the third upper electrode UE3.

The third lower electrode LE3 may constitute the second conductive layer. The third lower electrode LE3 and a corresponding transistor, e.g., first gate electrode GE1 of third transistor T3. The third upper electrode UE3 may constitute the third conductive layer, and overlap the third lower electrode LE3 in a plan view. The third upper electrode UE3 may be electrically connected to the third bottom metal layer BML3 through the corresponding contact hole CH.

As described above, the third upper electrode UE3 may be electrically connected to each of the first source region SE1 and the third source region SE3 through the third bottom metal layer BML3.

The protective layer PSV may be provided and/or formed on the first sub-pixel circuit SPXC1, the second sub-pixel circuit SPXC2, and the third sub-pixel circuit SPXC3, which are described above. The protective layer PSV may include a first via hole VIH1 and a second via hole VIH2.

The first via hole VIH1 may expose each of a region (or portion) of the 2bth power line PL2$b$, another region of the 2bth power line PL2$b$, and still another region of the 2bth power line PL2$b$. The second via hole VIH2 may expose each of a region (or portion) of the first upper electrode UE1, a region (or portion) of the second upper electrode UE2, and a region (or portion) of the third upper electrode UE3. In an embodiment, three first via holes VIH1 may be provided in the first pixel area A1, and three second via holes VIH2 may be provided in the first pixel area A1.

A planar structure of the second pixel PXL2 and/or the third pixel PXL3 is provided below with reference to FIG. 7.

Referring to FIG. 7, the second pixel PXL2 and/or the third pixel PXL2 are/is distinguished from the first pixel PXL1 of FIG. 6, at least in that the first scan line S2_1 is omitted. Hereinafter, components substantially identical or similar to those already described are designated by like reference numerals, and overlapping descriptions will be omitted or simplified. The second pixel PXL2 and the third pixel PXL3 may have structures substantially identical or similar to each other.

As described above, the first sub-scan line S2_1 electrically connected to pixels PXL of the first area DA1 of FIG. 3 (i.e., at lower end (or lower portion) of the display panel DP) may be omitted in the second pixel area A2 and/or the third pixel area A3, not overlap the second pixel PXL2 and/or the third pixel PXL3 in a plan view. Thus, in case that the first sub-scan line S2_1 is omitted in the second pixel area A2 and/or the third pixel area A3, the second sub-scan line S2_2 of the second pixel PXL2 and/or the third pixel PXL3 may have a line width extended by a space in which the first sub-scan lines S2_1 are omitted. For example, the first sub-scan line S2_1 may be omitted in the second pixel area A2 and/or the third pixel area A3, and the line width of the second sub-scan line S2_2 in the second pixel area A2 and/or the third pixel area A3 may be increased by the space secured (or formed) by the omission of the first sub-scan line S2_2.

As shown in FIG. 10, a width WS2 of the second sub-scan line S2_2 of the second pixel PXL2 and/or the third pixel PXL3 in the first direction DR1 may be greater than a width WS2 of the second sub-scan line S2_2 of the first pixel PXL1 in the first direction DR1. The width WS2 of the second sub-scan line S2_2 of the second pixel PXL2 and/or the third pixel PXL3 in the first direction DR1 may be greater than a width WS1 of the first sub-scan line S2_1 of the first pixel PXL1 in the first direction DR1. The width WS2 of the second sub-scan line S2_2 of the second pixel PXL2 and/or the third pixel PXL3 in the first direction DR1 may be greater than a sum of the width WS1 of the first sub-scan line S2_1 of the first pixel PXL1 in the first direction DR1 and the width WS2 of the second sub-scan line S2_2 of the first pixel PXL1 in the first direction DR1, but the disclosure is not limited thereto.

The width WS2 of the second sub-scan line S2_2 of the third pixel PXL3 in the first direction DR1 may be substantially equal to the width WS2 of the second sub-scan line S2_2 of the second pixel PXL2 in the first direction DR1, but the disclosure is not limited thereto.

As described above, the second sub-scan line S2_2 may have a line width extended by a space in which the first sub-scan lines S2_1 are omitted in the second pixel PXL2 and/or the third pixel PXL3. For example, the line width of the second sub-scan line S2_2 may be increased by the space secured (or formed) by the omission of the first sub-scan lines S2_1 in the second pixel PXL2 and/or the third pixel PXL3. Accordingly, resistance of the second sub-scan lines S2_2 electrically connected to pixels PXL of the second area DA2, e.g., at the upper end of the display panel DP, is decreased, so that a charging rate can be improved.

As described above, the second sub-scan line S2_2 may be configured with conductive layers. For example, the second sub-scan line S2_2 may be implemented in the triple-layer structure including the first conductive line CL1, the second conductive line CL2, and the third conductive line CL3.

In an embodiment, the first conductive line CL1 of the second sub-scan line S2_2 may be commonly provided in some of pixels PXL located on the same pixel column in the second direction DR2. In an example, the first conductive line CL1 of the second sub-scan line S2_2 of the second pixel PXL2 may be commonly provided with at least one of third pixels PXL3 located on the same pixel column in the second direction DR2. For example, pixels PXL located on the same pixel column in the second direction DR2 may share the first conductive line CL1 of the second sub-scan line S2_2.

In the second pixel PXL2 and/or the third pixel PXL3, the second sub-scan line S2_2 may not be directly connected to the first scan line S1. For example, in the second pixel PXL2 and/or the third pixel PXL3, the first scan line S1 may not be in direct contact with the second sub-scan line S2_2.

Each of the second pixel PXL2 and/or the third pixel PXL3 and a fourth pixel PXL4 located on the same pixel row in the first direction DR1 may be commonly connected to the same first scan line S1. The first scan line S1 may be electrically connected to the second scan line S2 through a contact part CNT in the fourth pixel PXL4. For example, a predetermined signal provided from the second scan line S2 may be supplied to each of the first to third sub-pixel circuits SPXC1, SPXC2, and SPXC3 of the second pixel PXL2 and/or the third pixel PXL3 through the contact part CNT.

The second sub-scan line S2_2 of the second pixel PXL2 and/or the third pixel PXL3 may be electrically connected to a second sub-scan line S2_2 of a fourth pixel PXL4 located on the same pixel column in the second direction DR2. Accordingly, the second sub-scan line S2_2 of the second pixel PXL2 and/or the third pixel PXL3 may transfer, to the fourth pixel PXL4, a predetermined signal provided from the driving part via a corresponding pixel to the fourth pixel PXL4.

In accordance with the above-described embodiment, the first scan line S1 of the second pixel PXL2 and/or the third pixel PXL3 may be receive a predetermined signal transferred from the fourth pixel PXL4 located on the same pixel row in the first direction DR1. The second scan line S2 of the second pixel PXL2 and/or the third pixel PXL3 may transfer the predetermined signal transferred from the driving part to the fourth pixel PXL4 located on the same pixel column in the second direction DR2 through the contact part CNT. Accordingly, although the first scan line S1 and the second scan line S2 of the second pixel PXL2 and/or the third pixel PXL3 are not in direct contact with each other because the first scan line S1 and the second scan line S2 are not provided with the contact part CNT, the first scan line S1 and the second scan line S2 may be used as scan lines SC for transferring a predetermined signal supplied from the driving part to the corresponding pixel and the fourth pixel PXL4.

Subsequently, a planar structure of the fourth pixel PXL4 will be described with reference to FIGS. 8 and 9.

Referring to FIGS. 8 and 9, the fourth pixel PXL4 is distinguished from the first to third pixels PXL1, PXL2, and PXL3, in that the fourth pixel PXL4 includes a contact part CNT. In FIG. 8, a fourth pixel PXL4 is illustrated, which is provided in the fourth pixel area A4 between the first pixel area A1 and the second pixel area A2. In FIG. 9, a fourth pixel PXL4 is illustrated, which is provided in the fourth pixel area A4 between the second pixel area A2 and the third pixel area A3.

Hereinafter, components identical to those already described are designated by like reference numerals, and overlapping descriptions will be omitted or simplified.

The first scan line S1 of the fourth pixel PXL4 may be electrically connected to at least one of the first sub-scan line S2_1 and the second sub-scan line S2_2 through a contact part CNT. For example, as shown in FIGS. 8 and 12, the first scan line S1 of the fourth pixel PXL4 provided in the fourth pixel area A4 between the first pixel area A1 and the second pixel area A2 may be electrically connected to the first sub-scan line S2_1 through a contact part CNT. In an example, the first scan line S1 of the fourth pixel PXL4 may be electrically connected to the first conductive line CL1 of the first sub-scan line S2_1 through a contact part CNT penetrating the buffer layer BFL, the gate insulating layer GI, and the first interlayer insulating layer ILD1.

As shown in FIGS. 9 and 13, the first scan line S1 of the fourth pixel PXL4 provided in the fourth pixel area A4 between the second pixel area A2 and the third pixel area A3 may be electrically connected to the second sub-scan line S2_2 through a contact part CNT. In an example, the first scan line S1 of the fourth pixel PXL4 may be electrically connected to the first conductive line CL1 of the second sub-scan line S2_2 through a contact part CNT penetrating the buffer layer BFL, the gate insulating layer GI, and the first interlayer insulating layer ILD1.

Referring to FIGS. 9 and 10, in the fourth pixel PXL4, the first scan line S1 may be electrically connected to the first sub-scan line S2_1 or the second sub-scan line S2_2 through the contact part CNT, and a scan signal and a control signal from the first sub-scan line S2_1 or the second sub-scan line S2_2 may be selectively supplied to the first scan line S1. For example, in the fourth pixel PXL4, the second scan line S2 may be electrically connected to the first scan line S1 through the contact part CNT, so that the first scan signal S1 and the second scan signal S2 can be used as signal lines for transferring a scan signal and a control signal to some components, e.g., the second and third transistors T2 and T3 of each of the first to third sub-pixel circuits SPXC1, SPXC2, and SPXC3.

In accordance with the above-described embodiment, first sub-scan lines S2_1 electrically connected to pixels PXL of the first area DA1, i.e., at the lower end of the display panel DP may be omitted in the second pixel area A2 and/or the third area A3. Accordingly, the second sub-scan line S2_2 connected to pixels PXL of the second area DA2, i.e., at the upper end of the display panel DP can have a line width extended by a space in which the first sub-scan lines S2_1 are omitted. For example, the first sub-scan lines S2_1 may be omitted in the second pixel area A2 (e.g., refer to FIG. 3) and/or the third pixel area A3 (e.g., refer to FIG. 3), and the line width of the second sub-scan lines S2_2 in the second pixel area A2 (e.g., refer to FIG. 3) and/or the third pixel area A3 (e.g., refer to FIG. 3) may be increased by the space secured (or formed) by the omission of the first sub-scan lines S2_2. Thus, resistance of the second sub-scan lines S2_2 may be decreased, thereby improving a charging rate.

Subsequently, a display layer DPL of pixels PXL will be described in detail with reference to FIG. 14.

Figure 14:
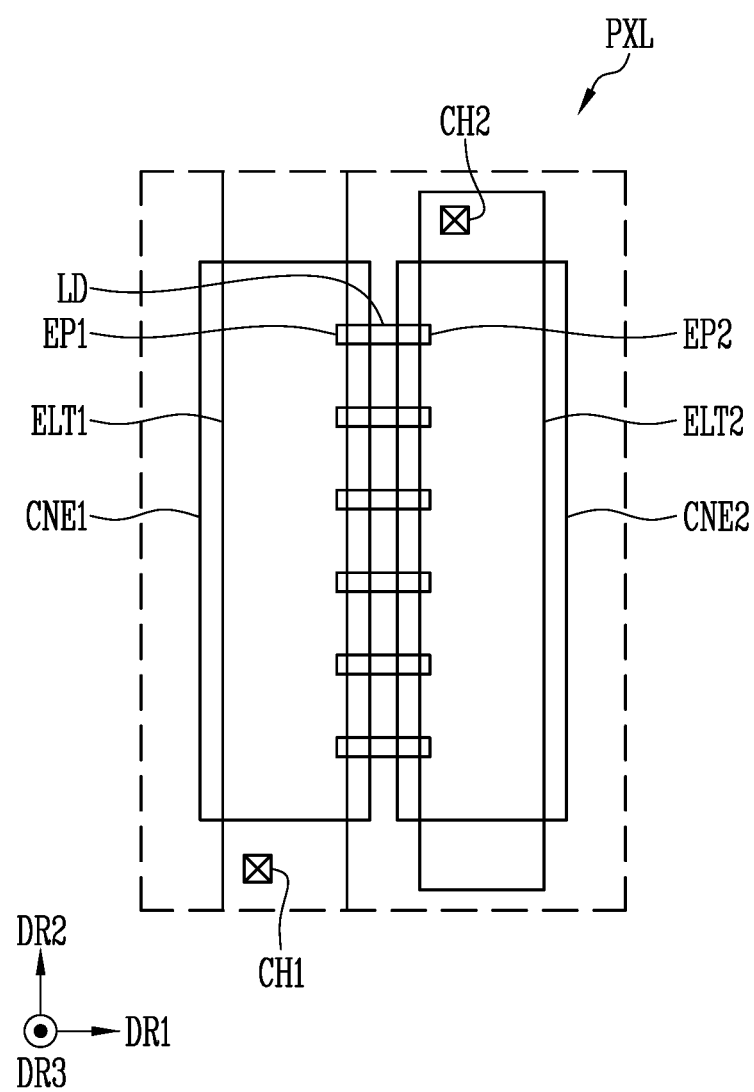
FIG. 14 is a schematic plan view illustrating a display layer of a pixel in accordance with an embodiment of the disclosure.

FIG. 14 is a schematic plan view illustrating a display layer of a pixel in accordance with an embodiment of the disclosure. Display layers DPL (e.g., refer to FIG. 15) of the above-described first to fourth pixels PXL1, PXL2, PXL3, and PXL4 (e.g., refer to FIG. 4) may have structures substantially identical or similar to one another.

Referring to FIG. 14, the pixel PXL may include a first electrode ELT1, a second electrode ELT2, and light emitting elements LD electrically connected between the first and second electrodes ELT1 and ELT2.

The first electrode ELT1 and the second electrode ELT2 may be spaced apart from each other. For example, the first electrode ELT1 and the second electrode ELT2 may extend in the second direction DR2, and be spaced apart from each other in the first direction DR1. However, the shapes, sizes, positions, and/or arrangement structure of the first electrode ELT1 and the second electrode ELT2 may be variously changed in some embodiments.

Each of the first electrode ELT1 and the second electrode ELT2 may have a pattern separated for each pixel PXL. For example, each of the pixels PXL may include the first electrode ELT1 and the second electrode ELT2. In another embodiment, each of the first electrode ELT1 and the second electrode ELT2 may have a pattern commonly connected (e.g., electrically connected) in pixels PXL.

Before light emitting elements LD are completely aligned, first electrodes ELT1 of the pixels PXL may be electrically connected to each other, and second electrodes ELT2 of the pixels PXL may be electrically connected to each other. For example, before the light emitting elements LD are completely aligned, the first electrodes ELT1 of the pixels PXL may be integrally or non-integrally connected to each other to constitute a first alignment line, and the second electrodes ELT2 of the pixels PXL may be integrally or non-integrally connected to each other to constitute a second alignment line.

The first alignment line and the second alignment line may be respectively supplied with a first alignment signal and a second alignment signal by a process of aligning the light emitting elements LD. The first and second alignment signals may have different wavelengths, potentials, and/or phases. Accordingly, an electric field may be formed between the first and second alignment lines, so that the light emitting elements LD may be aligned between the first and second alignment lines. After the light emitting elements LD are aligned (or completely aligned), the first electrodes ELT1 of the pixels PXL may be separated from each other by separating at least the first alignment line. For example, portions of the first alignment line, which are disposed between adjacent pixels PXL, may be removed, and the first electrodes ELT1 of the pixels PXL may be separated from each other. Accordingly, the pixels PXL may be individually driven.

The first electrode ELT1 may be electrically connected to at least one circuit element, a power line, and/or a signal line through a first contact hole CH1. In another embodiment, the first electrode ELT1 may be connected directly to a power line or a signal line. In an embodiment, the first electrode ELT1 may be electrically connected to the first transistor T1 of the pixel circuit PXC through the first contact hole CH1, and be electrically connected to the first power line PL1 through the first transistor T1.

The second electrode ELT2 may be electrically connected to at least one circuit element, a power line, and/or a signal line through a second contact hole CH2. In another embodiment, the second electrode ELT2 may be connected directly to a power line or a signal line. In an embodiment, the second electrode ELT2 may be electrically connected to the second power line PL2 through the second contact hole CH2.

Each of the first and second electrodes ELT1 and ELT2 may be configured as or implemented with, for example, a single layer or a multi-layer. In an example, each of the first and second electrodes ELT1 and ELT2 may include at least one reflective electrode layer including a reflective conductive material, and selectively further include at least one transparent electrode layer and/or at least one conductive capping layer.

The light emitting elements LD may be aligned between the first electrode ELT1 and the second electrode ELT2. For example, the light emitting elements LD may be aligned between the first electrode ELT1 and the second electrode ELT2, and electrically connected to the first and second electrodes ELT1 and ELT2.

In an embodiment, the light emitting elements LD may be subminiature pillar-shaped light emitting elements LD having a size small to a degree of nanometer scale to micrometer scale, which are described in the embodiments shown in FIGS. 1 and 2. However, the disclosure is not limited thereto.

Each light emitting element LD may include a first end portion EP1 and a second end portion EP2. The first end portion EP1 may be disposed adjacent to the first electrode ELT1, and the second end portion EP2 may be disposed adjacent to the second electrode ELT2.

In an embodiment, the first end portion EP1 of each of the light emitting elements LD may be electrically connected to the first electrode ELT1 through a first connection electrode CNE1. In another embodiment, the first end portion EP1 of each of the light emitting elements LD may be electrically connected (e.g., directly connected) to the first electrode ELT1. In still another embodiment, the first end portion EP1 of each of the light emitting elements LD may be electrically connected to only the first connection electrode CNE1, and may not be connected to the first electrode ELT1. The first connection electrode CNE1 may constitute an anode electrode of the light emitting part EMU, and connect the light emitting elements LD to a corresponding pixel circuit PXC through the first connection electrode CNE1.

Similarly, the second end portion EP2 of each of the light emitting elements LD may be electrically connected to the second electrode ELT2 through a second connection electrode CNE2. In another embodiment, the second end portion EP2 of each of the light emitting elements LD may be connected directly to the second electrode ELT2. In still another embodiment, the second end portion EP2 of each of the light emitting elements LD may be electrically connected to only the second connection electrode CNE2, and may not be connected to the second electrode ELT2. The second connection electrode CNE2 may constitute a cathode electrode of the light emitting part EMU, and connect the light emitting elements LD to the second power line PL2 through the second connection electrode CNE2.

The light emitting elements LD may be prepared in a form in which the light emitting elements LD are dispersed in a light emitting element ink, and the light emitting elements LD dispersed in the light emitting element ink may be supplied to each of the pixels PXL by an inkjet printing process, or the like. In an example, the light emitting elements LD may be provided to each of the pixels PXL and dispersed in a volatile solvent. In case that an alignment signal is supplied to the first and second electrodes ELT1 and ELT2 (or first and second alignment lines), an electric field may be formed (or disposed) between the first and second electrodes ELT1 and ELT2, and the light emitting elements LD may be aligned between the first and second electrodes ELT1 and ELT2. The light emitting elements LD may be stably arranged between the first and second electrodes ELT1 and ELT2 by volatilizing the solvent or removing the solvent in another manner after the light emitting elements LD are aligned. In case that predetermined alignment signals are applied to the first and second electrodes ELT1 and ELT2 (or first and second alignment lines), the light emitting elements LD may be aligned between the first and second electrodes ELT1 and ELT2. After the light emitting elements LD are aligned, the solvent may be removed by a drying process or the like.

The first connection electrode CNE1 and the second connection electrode CNE2 may be respectively disposed on the first end portions EP1 and the second end portions EP2 of the light emitting elements LD.

The first connection electrode CNE1 may be disposed on the first end portions EP1 of the light emitting elements LD, and electrically connected to the first end portions EP1. In an embodiment, the first connection electrode CNE1 may be disposed on the first electrode ELT1, and electrically connected to the first electrode ELT1. The first end portions EP1 of the light emitting elements LD may be electrically connected to the first electrode ELT1 through the first connection electrode CNE1.

The second electrode CNE2 may be disposed on the second end portions EP2 of the light emitting elements LD and electrically connected to the second end portions EP2. In an embodiment, the second connection electrode CNE2 may be disposed on the second electrode ELT2 and electrically connected to the second electrode ELT2. The second end portions EP2 of the light emitting elements LD may be electrically connected to the second electrode ELT2 through the second connection electrode CNE2.

Subsequently, a sectional structure of the pixel PXL will be described in detail with reference to FIGS. 15 and 16.

Figure 15:
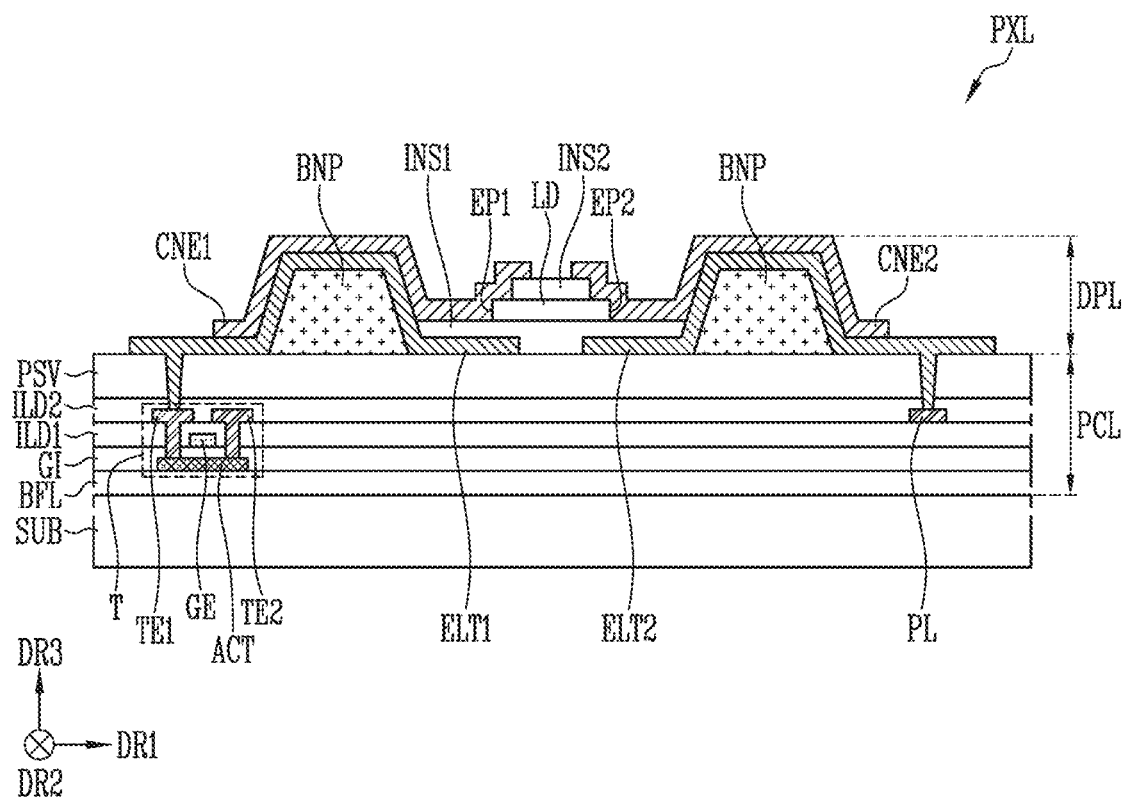
FIGS. 15 and 16 are schematic cross-sectional views illustrating a circuit layer and a display layer of a pixel in accordance with an embodiment of the disclosure.
Figure 16:
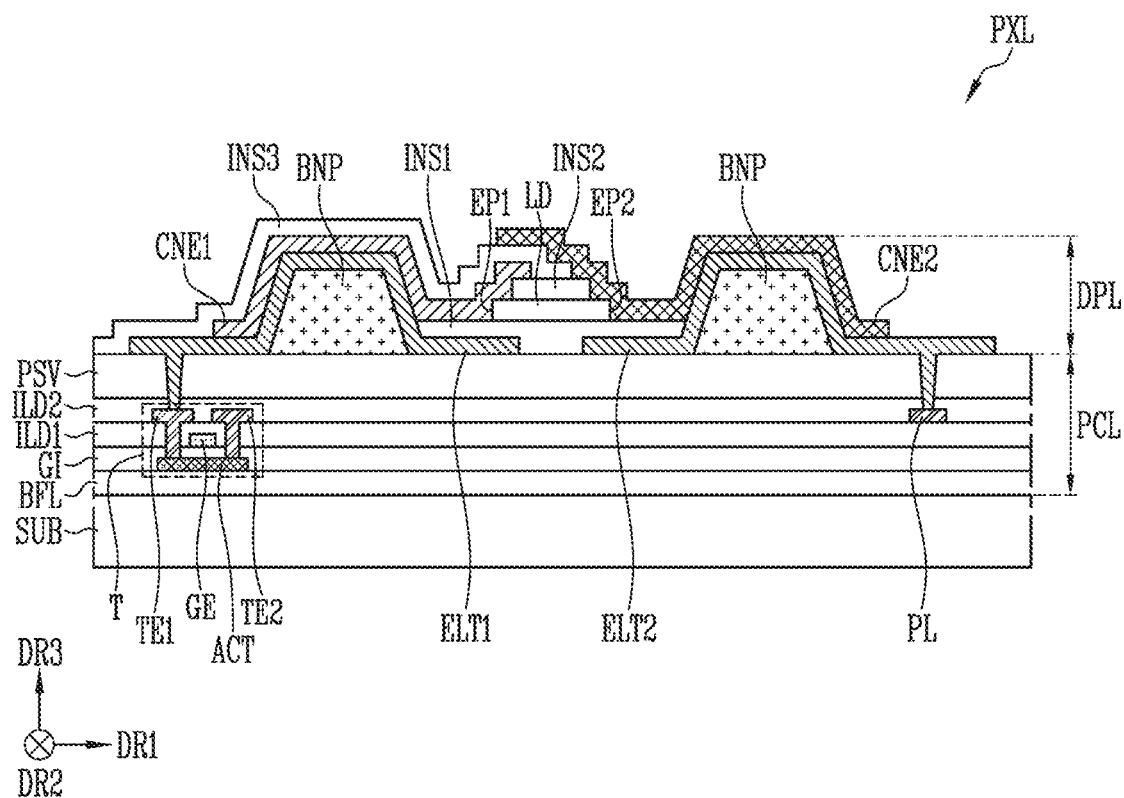

FIGS. 15 and 16 are schematic cross-sectional views illustrating a circuit layer and a display layer of a pixel in accordance with an embodiment of the disclosure. The above-described first to fourth pixels PXL1, PXL2, PXL3, and PXL4 may have structures substantially identical or similar to one another.

In FIGS. 15 and 16, the first transistor T1 among various circuit elements constituting the pixel circuit PXC (e.g., refer to FIG. 5) is illustrated. In case that the first to third transistors T1, T2, and T3 are designated without being distinguished from each other, each of the first to third transistors T1, T2, and T3 are inclusively referred to as a "transistor T." However, the structure of transistors T and/or the positions of the transistors T for each layer are/is not limited to the embodiment shown in FIGS. 15 and 16, and may be variously changed in some embodiments.

Referring to FIGS. 15 and 16, circuit elements (e.g., transistors T and storage capacitor Cst) constituting the pixel circuit PXC (e.g., refer to FIG. 5) and a circuit layer PCL including various lines electrically connected thereto may be disposed on a substrate SUB of the pixel PXL in accordance with the embodiment of the disclosure. First and second electrodes ELT1 and ELT2, light emitting elements LD, and/or first and second connection electrodes CNE1 and CNE2, which constitute the light emitting part EMU (e.g., refer to FIG. 5) may be disposed on the circuit layer PCL.

The above-described first conductive layer may be disposed on the substrate SUB. The first conductive layer may be formed in or implemented with, for example, a single layer including at least one selected from the group consisting of copper (Cu), molybdenum (Mo), tungsten (W), titanium (Ti), aluminum (Al), silver (Ag), and any alloy thereof or a mixture thereof, or be formed in or implemented with, for example, a double- or multi-layered structure including molybdenum (Mo), titanium (Ti), copper (Cu), aluminum (Al) or silver (Ag), which is a low-resistance material so as to decrease wiring resistance.

A buffer layer BFL may be disposed over the first conductive layer. The buffer layer BFL may prevent an impurity from being diffused into each circuit element. The buffer layer BFL may be configured as a single layer, but be configured as a multi-layer including at least two layers. In case that the buffer layer BFL is formed as or implemented with, for example, the multi-layer, the layers may be formed of (or include) a same material or be formed of different materials.

Transistors T may be disposed on the buffer layer BFL. Each of the transistors T may include an active pattern ACT, a gate electrode GE, a first transistor electrode TE1, and a second transistor electrode TE2.

The active pattern ACT may be disposed on the buffer layer BFL. In an example, the active pattern ACT may include a first region in contact with the first transistor electrode TE1, a second region in contact with the second transistor electrode TE2, and a channel region located between the first and second regions.

In an embodiment, the active pattern ACT may be made of poly-silicon, amorphous silicon, an oxide semiconductor, or the like. The channel region of the active pattern ACT may be a semiconductor pattern undoped with an impurity, and may be an intrinsic semiconductor. Each of the first and second regions of the active pattern ACT may be a semiconductor pattern doped with an impurity.

A gate insulating layer GI may be disposed over the active pattern ACT. In an example, the gate insulating layer GI may be disposed between the active pattern ACT and the gate electrode GE. The gate insulating layer GI may be configured as a single layer or a multi-layer, and include various kinds of inorganic insulating materials. For example, the inorganic insulating materials of the gate insulating layer GI may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The above-described second conductive layer may be disposed on the gate insulating layer GI. For example, the gate electrode GE may be disposed on the gate insulating layer GI. The gate electrode GE may be disposed on the gate insulating layer GI, and overlap the active pattern ACT in the third direction DR3.

A first interlayer insulating layer ILD1 may be disposed over the gate electrode GE. For example, the first interlayer insulating layer ILD1 may be disposed on the gate insulating layer GI, and cover the gate electrode GE. In an example, the first interlayer insulating layer ILD1 may be disposed between the gate electrode GE and the first and second transistor electrodes TE1 and TE2 and electrically insulate the gate electrode GE from the first and second transistor electrodes TE1 and TE2. The first interlayer insulating layer ILD1 may be configured as or implemented with, for example, a single layer or a multi-layer, and include various kinds of inorganic insulating materials. For example, the inorganic insulating materials of the first interlayer insulating layer ILD1 may include at least one silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The above-described conductive layer may be disposed on the first interlayer insulating layer ILD1. For example, the first transistor electrode TE1 and the second transistor electrode TE2 may be disposed on the first interlayer insulating layer ILD1. The first and second transistor electrodes TE1 and TE2 may overlap the active pattern ACT in the third direction DR3. The first and second transistor electrodes TE1 and TE2 may be electrically connected to the active pattern ACT. For example, the first transistor electrode TE1 may be electrically connected to the first region of the active pattern ACT through a contact hole penetrating the first interlayer insulating layer ILD and the gate insulating layer GI. The second transistor electrode TE2 may be electrically connected to the second region of the active pattern ACT through a contact hole penetrating the first interlayer insulating layer ILD and the gate insulating layer GI.

A power line PL may be disposed on the first interlayer insulating layer ILD1. The power line PL and the first and second transistor electrodes TE1 and TE2 may be disposed in a same layer. For example, the power line PL and the first transistor electrode TE1 and the second transistor electrode TE2 may be configured as a same conductive layer. For example, the power line PL and the first and second transistor electrodes TE1 and TE2 may be simultaneously formed by a same process, but the disclosure is not limited thereto.

A second interlayer insulating layer ILD2 may be disposed over the first and second transistor electrodes TE1 and TE2 and the power line PL. For example, the second interlayer insulating layer ILD2 may be disposed on the first interlayer insulating layer ILD1 and may cover (or overlap) the first and second transistor electrodes TE1 and TE2 and the power line PL. The second interlayer insulating layer ILD2 may be configured as a single layer or a multi-layer, and include various kinds of inorganic insulating materials. For example, the inorganic insulating materials of the second interlayer insulating layer ILD2 may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A protective layer PSV may be disposed over the circuit elements including the transistors T. The protective layer PSV may be made of an organic material to planarize a lower step difference. For example, the protective layer PSV may include an organic material such as acryl resin, epoxy resin, phenolic resin, polyamides resin, polyimides resin, unsaturated polyesters resin, poly-phenylene ethers resin, poly-phenylene sulfides resin, and benzocyclobutene (BCB). However, the disclosure is not limited thereto, and the protective layer PSV may include various kinds of inorganic insulating materials. For example, the inorganic insulating materials of the protective layer PSV may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A display layer DPL may be disposed on the protective layer PSV of the circuit layer PCL. The display layer DPL may include patterns BNP, the first and second electrodes ELT1 and ELT2, the light emitting elements LD, and/or the first and second connection electrodes CNE1 and CNE2.

The patterns BNP may be disposed on the protective layer PSV. In an embodiment, the patterns BNP may have various shapes. In an embodiment, the patterns BNP may have a shape protruding in the third direction DR3 on the substrate SUB. The patterns BNP may be formed to have an inclined surface inclined at a predetermined angle with respect to the substrate SUB. However, the disclosure is not limited thereto, and the patterns BNP may have a sidewall having a curved shape, a stepped shape, or the like. In an example, the patterns BNP may have a cross-section having a semicircular shape, a semi-elliptical shape, or the like.

Electrodes and insulating layers, which are disposed on the top of the patterns BNP, may have a shape (e.g., cross-sectional shape) corresponding to the patterns BNP. In an example, the first and second electrodes ELT1 and ELT2 disposed on the patterns BNP may include an inclined surface or a curved surface, which has a shape corresponding to that of the patterns BNP. Accordingly, the patterns NP and the first and second electrodes ELT1 and ELT2 provided on the top thereof may serve as a reflective member for guiding light emitted from the light emitting elements LD in a front direction of the pixel PXL, e.g., the third direction DR3, thereby improving the light emission efficiency of the display panel DP.

The patterns BNP may include at least one organic material and/or at least one inorganic material. In an example, the patterns BNP may include an organic material such as acryl resin, epoxy resin, phenolic resin, polyamides resin, polyimides resin, unsaturated polyesters resin, poly-phenylene ethers resin, poly-phenylene sulfides resin, or benzocyclobutene (BCB). However, the disclosure is not limited thereto, and the patterns BNP may include various kinds of inorganic insulating materials. For example, the inorganic insulating materials of the patterns BNP may include at least one of silicon oxide ($SiO_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), and titanium oxide (TiO$_x$).

The first and second electrodes ELT1 and ELT2 may be disposed on the protective layer PSV and the patterns BNP. The first and second electrodes ELT1 and ELT2 may be spaced apart from each other in the pixel PXL. An alignment signal may be supplied to the first and second electrodes ELT1 and ELT2 by a process of aligning the light emitting elements LD as described above. Accordingly, an electric field may be formed between the first and second electrodes ELT1 and ELT2, and the light emitting elements LD supplied to each pixel PXL may be aligned between the first and second electrodes ELT1 and ELT2.

Each of the first and second electrodes ELT1 and ELT2 may include at least one conductive material. In an example, each of the first and second electrodes ELT1 and ELT2 may include at least one metal or any alloy including the same among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, but the disclosure is not limited thereto.

A first insulating layer INS1 may be disposed on the first and second electrodes ELT1 and ELT2. The first insulating layer INS1 may be configured as a single layer or a multi-layer, and include various kinds of inorganic insulating materials. For example, the inorganic insulating materials of the first insulating layer INS1 may include at least one of silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), and titanium oxide (TiO$_x$).

The light emitting elements LD may be disposed on the first insulating layer INS1. The light emitting elements LD may be disposed between the first and second electrodes ELT1 and ELT2 on the first insulating layer INS1. The light emitting elements LD may be dispersed in a volatile solvent, and supplied to each of the pixels PXL. Subsequently, in case that an alignment signal is supplied through the first and second electrodes ELT1 and ELT2 (or first and second alignment lines), the electric field may be formed (or disposed) between the first and second electrodes ELT1 and ELT2, and the light emitting elements LD may be aligned between the first and second electrodes ELT1 and ELT2. After the light emitting elements LD are aligned, the solvent may be volatilized or removed, and the light emitting elements LD may be stably arranged between the first and second electrodes ELT1 and ELT2. In case that predetermined alignment signals are applied to the first and second electrodes ELT1 and ELT2 (or the first and second alignment lines), the light emitting elements LD may be aligned between the first and second electrodes ELT1 and ELT2. After the light emitting elements LD are aligned, the solvent may be removed by a drying process or the like.

A second insulating layer INS2 may be disposed on the light emitting elements LD. The second insulating layer INS2 may be partially disposed on the light emitting elements LD. For example, the second insulating layer INS2 may be disposed on portions of the light emitting elements LD. In case that the second insulating layer INS2 is formed on the light emitting elements LD after the light emitting elements LD are completely aligned, the light emitting elements LD may be prevented from being separated from a position at which the light emitting elements LD are aligned. For example, the second insulating layer INS2 may fix the light emitting elements LD at the aligned positions. The second insulating layer INS2 may be disposed on the light emitting elements LD, and may expose first and second end portions EP1 and EP2 of the light emitting elements LD.

The second insulating layer INS2 may be configured as a single layer or a multi-layer, and include various kinds of inorganic insulating materials. For example, the inorganic insulating materials of the second insulating layer INS2 may include at least one of silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), and titanium oxide (TiO$_x$).

The first and second connection electrodes CNE1 and CNE2 may be respectively disposed on the first and second end portions EP1 and EP2 of the light emitting elements LD, which are exposed by the second insulating layer INS2. The first and second connection electrodes CNE1 and CNE2 may be respectively disposed directly on the first and second end portions EP1 and EP2 of the light emitting elements LD, and contact the first and second end portions EP1 and EP2 of the light emitting elements LD.

In an embodiment, the first and second connection electrodes CNE1 and CNE2 may be disposed in a same layer. For example, the first and second connection electrodes CNE1 and CNE2 may be configured as a same conductive layer. The first and second connection electrodes CNE1 and CNE2 may be simultaneously formed by a same process, but the disclosure is not limited thereto.

In an embodiment, the first and second connection electrodes CNE1 and CNE2 may be disposed in different layers. For example, as shown in FIG. 16, a third insulating layer INS3 may be disposed over the first connection electrode CNE1, and the second connection electrode CNE2 may be disposed on the first connection electrode CNE1. In case that the first and second connection electrodes CNE1 and CNE2 are configured as different conductive layers, the third insulating layer INS3 may further be disposed between the first connection electrode CNE1 and the second connection electrode CNE2. The third insulating layer INS3 may cover (or overlap) the first connection electrode CNE1, and may expose the second end portion EP2 of the light emitting element LD. The second connection electrode CNE2 may be disposed on the second end portion EP2 of the light emitting element LD, which is exposed by the third insulating layer INS3. As described above, in case that the third insulating layer INS3 is disposed between the connection electrodes CNE1 and CNE2 configured as different conductive layers, the connection electrodes CNE1 and CNE2 may be stably separated from each other by the third insulating layer INS3, so that the electrical stability between the first and second end portions EP1 and EP2 of the light emitting elements LD can be ensured. Accordingly, a short-circuit defect can be effectively prevented from occurring between the first and second end portions EP1 and EP2 of the light emitting elements LD.

Each of the first and second connection electrodes CNE1 and CNE2 may be made of various transparent conductive materials. In an example, each of the first and second connection electrodes CNE1 and CNE2 may include at least one of various transparent conductive materials including Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO). Each of the first and second connection electrodes CNE1 and CNE2 may be implemented substantially transparently or translucently to satisfy a predetermined transmittance. Accordingly, light emitted from the first and second end portions EP1 and EP2 of the light emitting elements LD can be emitted to the outside of the display panel DP while passing through the first and second connection electrodes CNE1 and CNE2.

The third insulating layer INS3 may be configured as a single layer or a multi-layer, and include various kinds of inorganic insulating materials. For example, the inorganic insulating materials of the third insulating layer INS3 may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In accordance with the above-described embodiment, the first sub-scan lines S2_1 electrically connected to the pixels PXL of the first area DA1, i.e., at the lower end of the display panel DP may be omitted in the second pixel area A2 and/or the third pixel area A3. Accordingly, the second sub-scan lines S2_2 electrically connected to the pixels PXL of the second area DA2, i.e., at the upper end of the display panel DP may have a line width extended by a space in which the first sub-scan lines S2_1 are omitted. For example, the first sub-scan lines S2_1 may be omitted in the second pixel area A2 (e.g., refer to FIG. 3) and/or the third pixel area A3 (e.g., refer to FIG. 3), and the line width of the second sub-scan lines S2_2 in the second pixel area A2 (e.g., refer to FIG. 3) and/or the third pixel area A3 (e.g., refer to FIG. 3) may be increased by the space secured (or formed) by the omission of the first sub-scan lines S2_2. Thus, resistance of the second sub-scan lines S2_2 may be decreased, thereby improving a charging rate.

Hereinafter, another embodiment will be described. In the following embodiment, components substantially identical or similar to those already described are designated by like reference numerals, and repetitive descriptions will be omitted or simplified.

Figure 17:
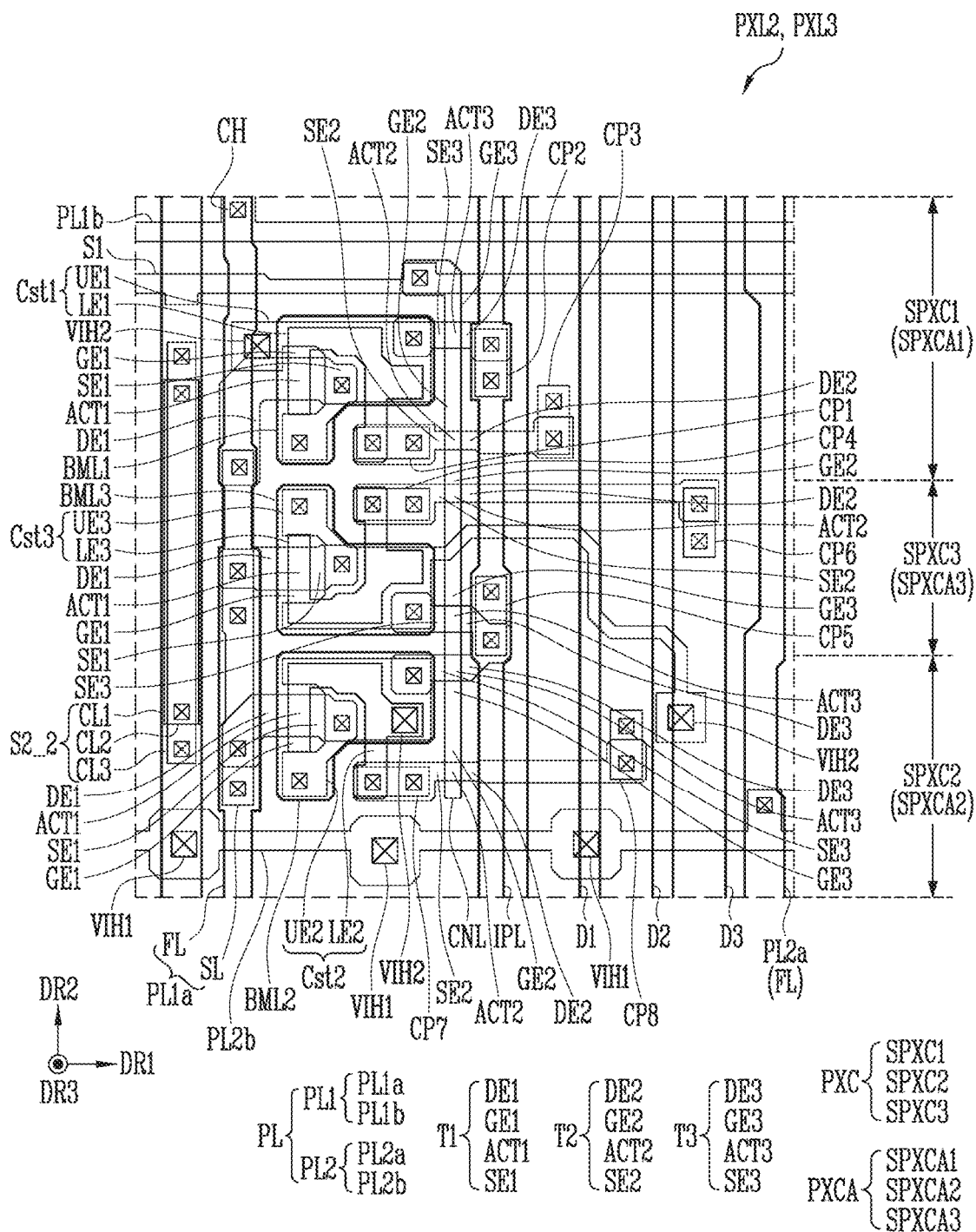
FIG. 17 is a schematic plan view illustrating a circuit layer of a second pixel and/or a third pixel in accordance with another embodiment of the disclosure.
Figure 18:
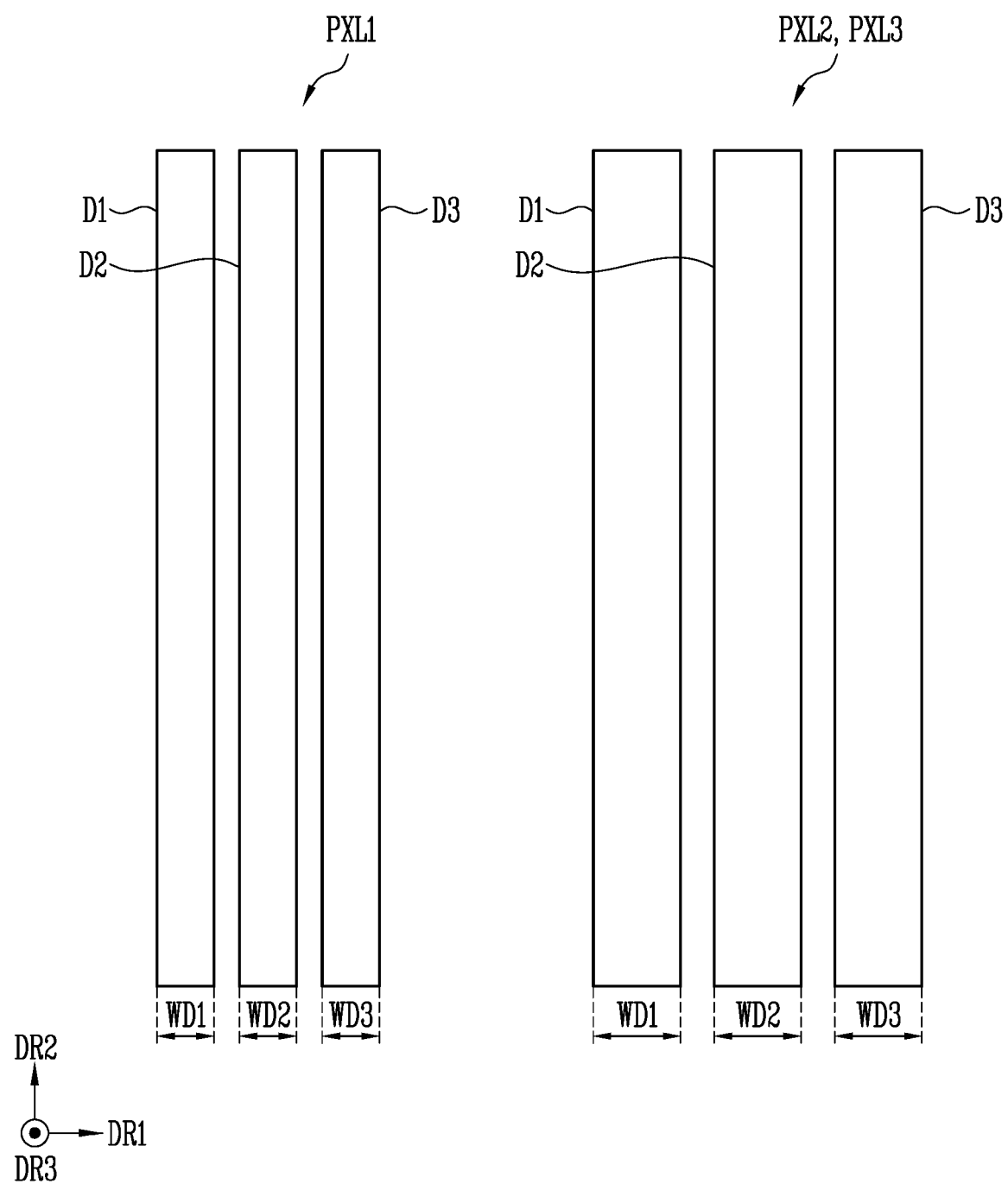
FIG. 18 is a schematic plan view illustrating data lines of a first pixel, a second pixel, and/or a third pixel in accordance with another embodiment of the disclosure.
Figure 19:
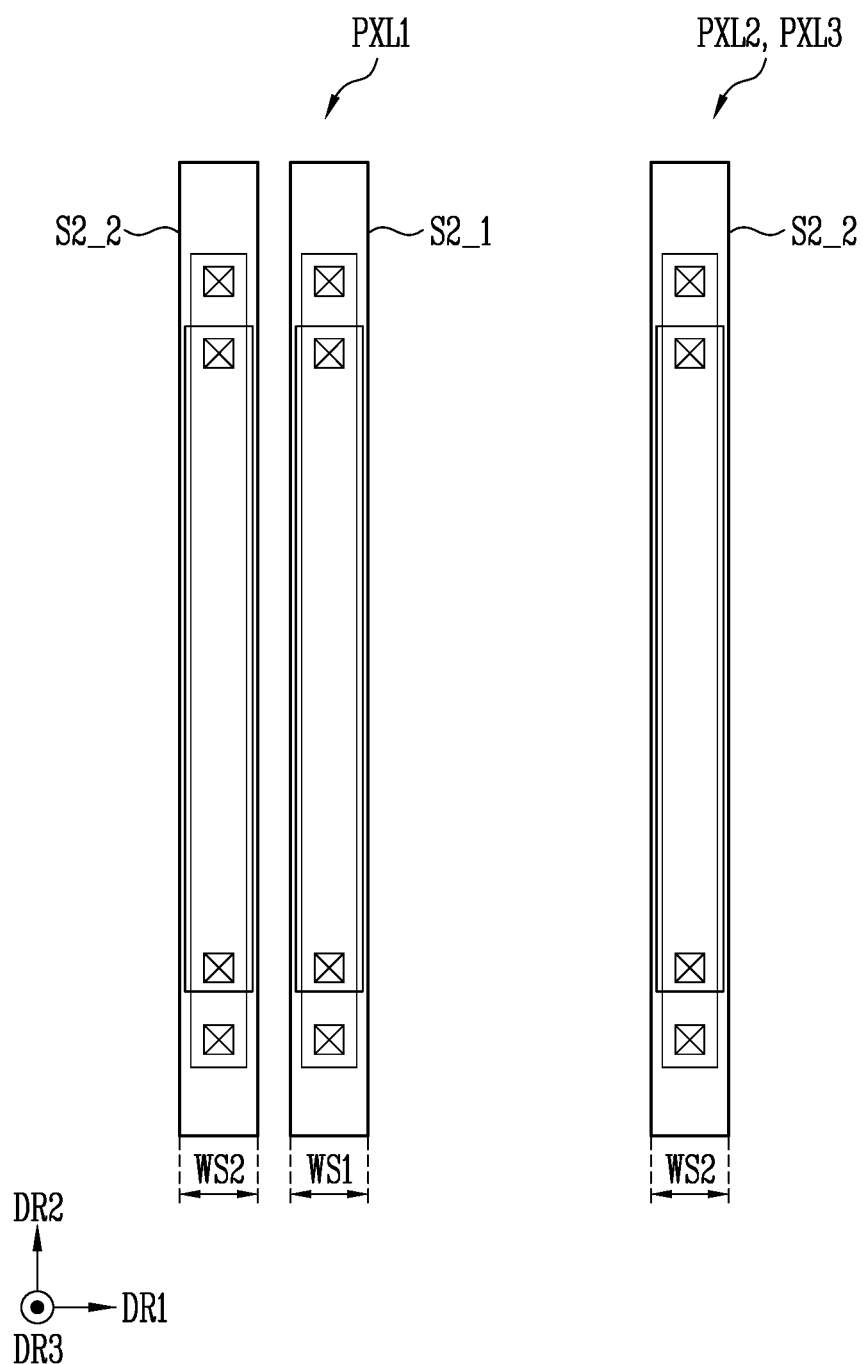
FIG. 19 is a plan view schematically illustrating second scan lines of a first pixel, a second pixel, and/or a third pixel in accordance with another embodiment of the disclosure.

FIG. 17 is a schematic plan view illustrating a circuit layer of a second pixel and/or a third pixel in accordance with another embodiment of the disclosure. FIG. 18 is a schematic plan view illustrating data lines of a first pixel, a second pixel, and/or a third pixel in accordance with another embodiment of the disclosure. FIG. 19 is a schematic plan view illustrating second scan lines of a first pixel, a second pixel, and/or a third pixel in accordance with another embodiment of the disclosure.

Referring to FIG. 17, a second pixel PXL2 and/or a third pixel PXL3 in accordance with this embodiment is distinguished from the embodiment shown in FIG. 7, at least in that a first sub-scan line S2_1 is omitted, and line widths of data lines D1, D2, and D3 are extended (or increased).

As described above, the first sub-scan line S2_1 electrically connected to the pixels PXL of the first area DA1, i.e., at the lower end of the display panel DP may be omitted in the second pixel area A2 and/or the third pixel area A3. The data lines D1, D2, and D3 of the second pixel PXL2 and/or the third pixel PXL3 may have a line width extend by a space in which the first sub-scan line S2_1 is omitted. For example, the first sub-scan line S2_1 may be omitted in the second pixel area A2 (e.g., refer to FIG. 3) and/or the third pixel area A3 (e.g., refer to FIG. 3), and the line width of the data lines D1, D2, and D3 of the second pixel PXL2 and/or the third pixel PXL3 may be increased by the space secured (or formed) by the omission of the first sub-scan line S2_2.

Referring to FIG. 18, a width WD1 of a first data line D1 of the second pixel PXL2 and/or the third pixel PXL3 in the first direction DR1 may be greater than a width WD1 of a first data line D1 of the first pixel PXL1 in the first direction DR1. A width WD2 of a second data line D2 of the second pixel PXL2 and/or the third pixel PXL3 in the first direction DR1 may be greater than a width WD2 of a second data line D2 of the first pixel PXL1 in the first direction DR1. A width WD3 of a third data line D3 of the second pixel PXL2 and/or the third pixel PXL3 in the first direction DR1 may be greater than a width WD3 of a third data line D3 of the first pixel PXL1 in the first direction DR1.

A width WD1 of a first data line D1 of the third pixel PXL3 in the first direction DR1 may be substantially equal to the width WD1 of the first data line D1 of the second pixel PXL2 in the first direction DR1. A width WD2 of a second data line D2 of the third pixel PXL3 in the first direction DR1 may be substantially equal to the width WD2 of the second data line D2 of the second pixel PXL2 in the first direction DR1. A width WD3 of a third data line D3 of the third pixel PXL3 in the first direction DR1 may be substantially equal to the width WD3 of the third data line D3 of the second pixel PXL2 in the first direction DR1. However, the disclosure is not limited thereto.

In an embodiment, as shown in FIG. 19, a width WS2 of a second sub-scan line S2_2 of the second pixel PXL2 and/or the third pixel PXL3 in the first direction DR1 may be substantially equal to a width WS2 of a second sub-scan line S2_2 of the first pixel PXL1 in the first direction DR1. The width WS2 of the second sub-scan line S2_2 of the second pixel PXL2 and/or the third pixel PXL3 in the first direction DR1 may be substantially equal to the width WS1 of a first sub-scan line S2_1 of the first pixel PXL1 in the first direction DR1.

However, the disclosure is not limited thereto, and the second sub-scan lines S2_2 and the data lines D1, D2, and D3 of the second pixel area A2 and/or the third pixel area A3 may have a line width extended by a space in which the first sub-scan line S2_1 is omitted. For example, the first sub-scan lines S2_1 may be omitted in the second pixel area A2 (e.g., refer to FIG. 3) and/or the third pixel area A3 (e.g., refer to FIG. 3), and the line width of the second sub-scan lines S2_2 and the data lines D1, D2, and D3 in the second pixel area A2 (e.g., refer to FIG. 3) and/or the third pixel area A3 (e.g., refer to FIG. 3) may be increased by the space secured (or formed) by the omission of the first sub-scan lines S2_2. As described in FIG. 10, the width WS2 of the second sub-scan line S2_2 of the second pixel PXL2 and/or the third pixel PXL3 in the first direction DR1 may be greater than the width WS2 of the second sub-scan line S2_2 of the first pixel PXL1 in the first direction DR1. The width WS2 of the second sub-scan line S2_2 of the second pixel PXL2 and/or the third pixel PXL3 in the first direction DR1 may be greater than the width WS1 of the first sub-scan line S2_1 of the first pixel PXL1 in the first direction DR1.

In accordance with the above-described embodiment, the data lines D1, D2, and D3 of the second pixel PXL2 and/or the third pixel PXL3 may have the line width extended by a space in which the first sub-scan lines S2_1 electrically connected to the pixels PXL of the first area DA1, i.e., at the lower end of the display panel DP are omitted. For example, the line width of the data lines D1, D2, and D3 of the second pixel PXL2 and/or the third pixel PXL3 may be increased by the space secured (or formed) by the omission of the first sub-scan lines S2_1 in the first area DA1 (e.g., refer to FIG.

3). For example, the time constant distribution of signal lines can be optimized, thereby improving a charging rate.

In accordance with the disclosure, first sub-scan lines electrically connected to pixels at a lower end of the display panel may be omitted in a pixel area at an upper end of the display panel. Accordingly, second sub-scan lines electrically connected to pixels at an upper end of the display panel may have a line width extended by a space in which the first sub-scan lines are omitted, so that resistance of the second sub-scan lines may be decreased, thereby improving a charging rate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure.

What is claimed is:

1. A display device comprising:
a display area including pixels;
a non-display area adjacent to the display area;
a first pixel area and a second pixel area, each provided in the display area;
a scan line extending in a first direction and disposed in the first pixel area and the second pixel area;
a first sub-scan line extending in a second direction and disposed in the first pixel area, the second direction intersecting the first direction;
a second sub-scan line extending in the second direction and disposed in the first pixel area and the second pixel area; and
a pad part provided in the non-display area adjacent to the display area, wherein
the pad part is electrically connected to the first sub-scan line and the second sub-scan line,
the scan line is electrically connected to at least one of the first sub-scan line and the second sub-scan line,
the first sub-scan line does not overlap the second pixel area in a plan view, and
a width of the second sub-scan line of the second pixel area is equal to about a sum of a width of the first sub-scan line of the first pixel area, a width of the second sub-scan line of the first pixel area, and a width between the first sub-scan line of the first pixel area and the second sub-scan line of the first pixel area.

2. The display device of claim 1, wherein the first pixel area is disposed between the second pixel area and the pad part.

3. The display device of claim 1, wherein the display area includes:
a first area; and
a second area divided from the first area with respect to a central line extending in the first direction, and
the first area is disposed between the pad part and the second area.

4. The display device of claim 3, wherein
the first sub-scan line is electrically connected to the scan line disposed in the first area, and
the second sub-scan line is electrically connected to another scan line disposed in the second area.

5. The display device of claim 1, further comprising:
a data line extending in the second direction and disposed in the first pixel area and the second pixel area.

6. The display device of claim 5, wherein a width of the data line of the second pixel area is greater than a width of the data line of the first pixel area.

7. The display device of claim 1, wherein the scan line is electrically connected to the first sub-scan line through a contact part between the first pixel area and the second pixel area.

8. The display device of claim 1, further comprising:
a third pixel area provided in the display area, wherein the second pixel area is disposed between the first pixel area and the third pixel area.

9. The display device of claim 8, wherein the second sub-scan line extends in the second direction and is disposed in the third pixel area.

10. The display device of claim 9, wherein a width of the second sub-scan line of the third pixel area is substantially equal to a width of the second sub-scan line of the second pixel area.

11. The display device of claim 9, wherein a width of the second sub-scan line of the third pixel area is greater than a width of the second sub-scan line of the first pixel area.

12. The display device of claim 9, wherein another scan line is electrically connected to the second sub-scan line through a contact part between the second pixel area and the third pixel area.

13. The display device of claim 8, wherein the first sub-scan line does not overlap the third pixel area in a plan view.

14. The display device of claim 1, further comprising:
a first electrode;
a second electrode spaced apart from the first electrode in the first pixel area and the second pixel area; and
a light emitting element disposed between the first electrode and the second electrode.

15. The display device of claim 14, further comprising:
a first connection electrode electrically connecting the first electrode to a first end of the light emitting element to each other; and
a second connection electrode electrically connecting the second electrode to a second end of the light emitting element to each other.

* * * * *